United States Patent
Yoo et al.

(10) Patent No.: US 11,720,184 B2
(45) Date of Patent: Aug. 8, 2023

(54) DISPLAY DEVICE AND TOUCH SENSING SYSTEM INCLUDING CODE PATTERNS FOR MORE ACCURATE INPUT

(71) Applicant: Samsung Display Co., LTD., Yongin-si (KR)

(72) Inventors: Gi Na Yoo, Cheonan-si (KR); Won Sang Park, Yongin-si (KR); Chang Woo Shim, Cheonan-si (KR); Seong Jun Lee, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/703,501

(22) Filed: Mar. 24, 2022

(65) Prior Publication Data
US 2023/0045827 A1 Feb. 16, 2023

(30) Foreign Application Priority Data
Aug. 12, 2021 (KR) .................. 10-2021-0106769

(51) Int. Cl.
*G06F 3/03* (2006.01)
*H10K 59/40* (2023.01)
(Continued)

(52) U.S. Cl.
CPC ........ *G06F 3/0317* (2013.01); *G06F 3/03545* (2013.01); *G06F 3/0412* (2013.01);
(Continued)

(58) Field of Classification Search
CPC .... G06F 3/0412; G06F 3/044; G06F 3/04883; G06F 3/03545; G06F 3/0317;
(Continued)

(56) References Cited

U.S. PATENT DOCUMENTS 9,170,449 B2   10/2015  Baek et al.
9,495,041 B2   11/2016  Baek et al.
(Continued)

FOREIGN PATENT DOCUMENTS

| CN | 108874220 | 11/2018 | |
| CN | 108874220 A | * 11/2018 | ........... G06F 3/0412 |

(Continued)

OTHER PUBLICATIONS

Extended European search report for European Patent Application or Patent No. 22183313.0, dated Jan. 4, 2023.

*Primary Examiner* — Darlene M Ritchie
(74) *Attorney, Agent, or Firm* — Kile Park Reed & Houtteman PLLC

(57) ABSTRACT

A display device includes a thin-film transistor layer disposed on a substrate, the thin-film transistor layer including a thin-film transistor, a light emitting element layer disposed on the thin-film transistor layer, the light emitting element layer including a pixel defining layer defining emission areas, and a pixel electrode disposed in each of the emission areas, a touch electrode disposed on the light emitting element layer, the touch electrode overlapping the pixel defining layer and sensing a touch, and a code pattern defined by a planar shape of the pixel defining layer that is distinguished from the pixel electrode and the touch electrode, the code pattern having position information.

19 Claims, 19 Drawing Sheets

(51) Int. Cl.
*H10K 59/122* (2023.01)
*H10K 50/86* (2023.01)
*G06F 3/0354* (2013.01)
*H01L 25/16* (2023.01)
*G06F 3/044* (2006.01)
*G06F 3/041* (2006.01)
*H10K 59/38* (2023.01)
*H10K 59/35* (2023.01)

(52) U.S. Cl.
CPC .......... *H01L 25/167* (2013.01); *H10K 50/86* (2023.02); *H10K 59/122* (2023.02); *H10K 59/40* (2023.02); *G06F 3/044* (2013.01); *G06F 3/04162* (2019.05); *G06F 2203/04112* (2013.01); *H10K 59/35* (2023.02); *H10K 59/38* (2023.02)

(58) Field of Classification Search
CPC . H01L 27/323; H01L 27/322; H01L 27/3246; H01L 25/167; H01L 51/5281
See application file for complete search history.

(56) References Cited

U.S. PATENT DOCUMENTS

| | | | |
|---|---|---|---|
| 10,936,126 B2* | 3/2021 | Lee | G06V 40/13 |
| 2005/0162400 A1* | 7/2005 | Tseng | G02F 1/13338 |
| | | | 345/173 |
| 2012/0249490 A1 | 10/2012 | Lee et al. | |
| 2013/0321351 A1* | 12/2013 | Paul | G06F 3/03545 |
| | | | 345/179 |
| 2013/0321357 A1 | 12/2013 | Lin | |
| 2017/0364175 A1* | 12/2017 | Park | G06F 3/0443 |
| 2019/0341428 A1 | 11/2019 | Lee et al. | |
| 2021/0141490 A1 | 5/2021 | Bang et al. | |
| 2022/0382402 A1* | 12/2022 | Kim | G06F 3/04164 |

FOREIGN PATENT DOCUMENTS

| | | |
|---|---|---|
| CN | 112447931 | 3/2021 |
| EP | 2759873 | 7/2014 |
| KR | 10-2018-0000040 | 1/2018 |
| KR | 10-2182828 | 11/2020 |

* cited by examiner

TL: TLa, TLb

DISPLAY DEVICE AND TOUCH SENSING SYSTEM INCLUDING CODE PATTERNS FOR MORE ACCURATE INPUT

CROSS-REFERENCE TO RELATED APPLICATION(S)

This application claims priority to and benefits of Korean Patent Application No. 10-2021-0106769 under 35 U.S.C. § 119, filed on Aug. 12, 2021 in the Korean Intellectual Property Office, the entire contents of which are incorporated herein by reference.

BACKGROUND

1. Technical Field

The disclosure relates to a display device and a sensing system including the same.

2. Description of the Related Art

As information society develops, demands for display devices for displaying images increase in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices. Among these flat panel display devices, a light emitting display device may include a light emitting element that enables each pixel of a display panel to emit light by itself. Thus, the light emitting display device can display an image without a backlight unit that provides light to the display panel.

A recent display device supports an input using a user's body part (e.g., a finger) and an input using an input pen. Since the display device senses the input using the input pen, the display device can sense an input more precisely than in case of sensing only the input using the user's body part.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device which can perform a corresponding function based on accurate input coordinates, reduce cost and power consumption and simplify a driving process by generating input coordinate data of an input device without complicated calculation and correction in case that an input is performed on the display device using the input device, and a sensing system including the display device.

However, aspects of the disclosure are not so restricted. The above and other aspects of the disclosure will become more apparent to one of ordinary skill in the art to which the disclosure pertains by referencing the detailed description of the disclosure given below.

According to an embodiment of the disclosure, a display device may include a thin-film layer disposed on a substrate, the thin-film transistor layer including a thin-film transistor, a light emitting element layer disposed on the thin-film transistor layer, the light emitting element layer including a pixel defining layer defining emission areas and a pixel electrode disposed in each of the emission areas, a touch electrode disposed on the light emitting element layer, the touch electrode overlapping the pixel defining layer and sensing a touch, and a code pattern defined by a planar shape of the pixel defining layer that is distinguished from the pixel electrode and the touch electrode, the code pattern having position information.

The pixel defining layer may absorb light of a specific wavelength, and the pixel electrode and the touch electrode may reflect, the light of the specific wavelength.

The pixel defining layer may have a transmittance of about 15% or less for a wavelength of about 800 nm to about 900 nm.

The emission areas may include a first emission area emitting light of a first color, a second emission area emitting light of a second color different from the first color, and a third emission area emitting light of a third color different from the first and second colors. The pixel defining layer may include a first code surrounding the first emission area and surrounded by the touch electrode, a second code surrounding the second emission area and surrounded by the touch electrode, and a third code surrounding the third emission area and surrounded by the touch electrode.

The pixel defining layer may further include a code connection part exposed to light of a specific wavelength by a cut part of the touch electrode and connecting adjacent codes among the first through third codes.

The code pattern may include the adjacent codes among the first through third codes and the code connection part.

An area of the first emission area may be larger than an area of the second emission area, and an area of the second code may be larger than an area of the first code.

The display device may further include an encapsulation layer overlapping the light emitting element layer. The touch electrode may be disposed on the encapsulation layer.

The display device may further include an encapsulation layer overlapping the light emitting element layer, color filters disposed on the encapsulation layer in the emission areas, and a light blocking part disposed on the encapsulation layer adjacent to the color filters. The touch electrode may be overlapped by the light blocking part.

The light blocking part may transmit light of a specific wavelength, the pixel defining layer may absorb the light of the specific wavelength, and the pixel electrode and the touch electrode may reflect the light of the specific wavelength.

The display device may further include an encapsulation layer overlapping the light emitting element layer, an insulating layer disposed on the encapsulation layer, color filters disposed on the insulating layer in the emission areas, and a light blocking part disposed on the insulating layer adjacent to the color filters. The touch electrode may be overlapped by the insulating layer.

The display device may further include a polarizing film disposed on the light emitting element layer, and a base part disposed on the polarizing film. The touch electrode may be disposed on the base part.

The display device may further include a polarizing film disposed on the light emitting element layer, and a base part disposed on the polarizing film. The touch electrode may be disposed between the polarizing film and the base part.

According to an embodiment of the disclosure, a display device may include a thin-film transistor layer disposed on a substrate, the thin-film transistor layer including a thin-film transistor, a light emitting element layer disposed on the thin-film transistor layer, the light emitting element layer including a pixel defining layer defining emission areas, a first electrode disposed in each of the emission areas, a second electrode spaced apart from the first electrode in each of the emission areas, and light emitting diodes disposed between the first electrode and the second electrode, a touch electrode disposed on the light emitting element layer, the touch electrode overlapping the pixel defining layer and sensing a touch, and a code pattern defined by a planar shape of the pixel defining layer that is distinguished from the first electrode, the second electrode, and the touch electrode, the code pattern having position information.

The display device may further include a wavelength conversion part disposed on the light emitting element layer to correspond to one of the emission areas, the wavelength conversion part converting a peak wavelength of light provided from the light emitting diodes, a light blocking part adjacent to the wavelength conversion part, and a base part disposed on the wavelength conversion part and the light blocking part. The touch electrode may be disposed between the light blocking part and the base part.

The light blocking part, may transmit light of a specific wavelength, the pixel defining layer may absorb the light of the specific wavelength, and the first electrode, the second electrode, and the touch electrode may reflect the light of the specific wavelength.

The display device may further include a wavelength conversion part disposed on the light emitting element layer to correspond to one of the emission areas, the wavelength conversion part converting a peak wavelength of light provided from the light emitting diodes, a light blocking part adjacent to the wavelength conversion part, and a base part disposed on the wavelength conversion part and the light blocking part. An upper surface of the touch electrode may be overlapped by the light blocking part.

According to an embodiment of the disclosure, a display device may include a thin-film transistor layer disposed on a substrate, the thin-film transistor layer including a thin-film transistor, a light emitting element layer disposed on the thin-film transistor layer, the light emitting element layer including a pixel defining layer defining emission areas, and a pixel electrode disposed in each of the emission areas, a metal pattern disposed on the light emitting element layer, the metal pattern overlapping the pixel defining layer, and a code pattern defined by a planar shape of the pixel defining layer that is distinguished from the pixel electrode and the metal pattern, the code pattern having position information.

The metal pattern may be electrically independent and electrically float.

According to an embodiment of the disclosure, a sensing system may include a display device displaying an image, and an input device approaching or touching the display device resulting in an input. The display device may include a thin-film transistor layer disposed on a substrate, the thin-film transistor layer including a thin-film transistor, a light emitting element layer disposed on the thin-film transistor layer, the light emitting element layer including a pixel defining layer defining emission areas, and a pixel electrode disposed in each of the emission areas, a touch electrode disposed on the light emitting element layer, the touch electrode overlapping the pixel defining layer and sensing a touch, and code patterns defined by a planar shape of the pixel defining layer that is distinguished from the pixel electrode and the touch electrode, the code patterns having position information. The input device may photograph the code patterns, the input device may convert the code patterns into preset data codes, and the input device may transmit coordinate data including the preset data codes to the display device.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF THE EMBODIMENTS

Figure 1:
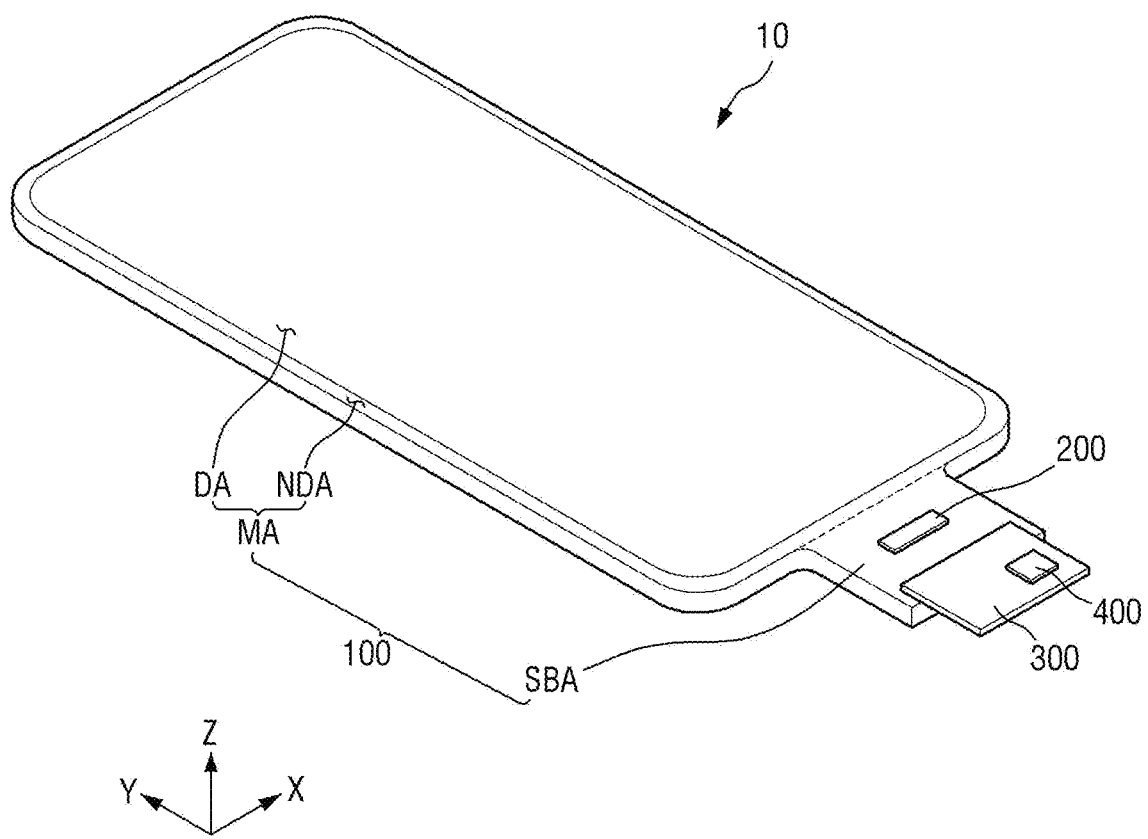
FIG. 1 is a schematic perspective view of a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more aspects disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there may be no intervening elements or layers present. To this end, the term "connected" may refer to physical, electrical, and/or fluid connection, with or without intervening elements.

Further, the X-axis, the Y-axis, and the Z-axis may not be limited to three axes of a rectangular coordinate system (e.g., the X-, Y-, and Z-axes), and may be interpreted in a broader sense. For example, the X-axis, the Y-axis, and the Z-axis may be perpendicular to one another, or may represent different directions that may not be perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or."

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well (and vice versa), unless the context clearly indicates otherwise. Moreover, the terms "comprises," "comprising," "includes," "including," "has," "having," and the like, when used in this specification, specify the presence of stated features, integers, steps, operations, elements, components, and/or groups thereof, but do not preclude the presence or addition of one or more other features, integers, steps, operations, elements, components, and/or groups thereof. "About", "approximately", "substantially" and the like are inclusive of the stated value and mean within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within $\pm 30\%$, 20%, 10%, 5% of the stated value.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules may be physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. When an element is described as "not overlapping" or "to not overlap" another element, this may include that the elements are spaced apart from each other, offset from each other, or set aside from each other or any other suitable term as would be appreciated and understood by those of ordinary skill in the art.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

FIG. 1 is a schematic perspective view of a display device 10 according to an embodiment.

Referring to FIG. 1, the display device 10 may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). In other embodiments, the display device 10 may be applied as a display unit of a television, a notebook computer, a monitor, a billboard, or an Internet of things (IoT) device. In other embodiments, the display device 10 may be applied to wearable devices such as smart watches, watch phones, glass-like displays, and head-mounted displays (HMDs).

The display device 10 may have a planar shape similar to a quadrangle. For example, the display device 10 may have a planar shape similar to a quadrangle having short sides in an X-axis direction and long sides in a Y-axis direction. Each corner where a short side extending in the X-axis direction meets a long side extending in the Y-axis direction may be rounded with a curvature or may be right-angled. The planar shape of the display device 10 is not limited to the quadrangular shape but may also be similar to other polygonal shapes, a circular shape, or an oval shape.

The display device 10 may include a display panel 100, a display driver 200, a circuit board 300, and a touch driver 400.

The display panel 100 may include a main area MA and a sub-area SBA.

The main area MA may include a display area DA including pixels displaying an image and a non-display area NDA disposed adjacent to (around) the display area DA. The display area DA may emit light from emission areas or opening areas. For example, the display panel 100 may include a pixel circuit including switching elements, a pixel defining layer defining the emission areas or the opening areas, and a self-light emitting element.

For example, the self-light emitting element may include, but is not limited to, at least one of an organic light emitting diode including an organic light emitting layer, a quantum dot light emitting diode including a quantum dot light emitting layer, an inorganic light emitting diode including an inorganic semiconductor, and a micro light emitting diode.

The non-display area NDA may be an area outside the display area DA. The non-display area NDA may be defined as an edge area of the main area MA of the display panel 100. The non-display area NDA may include a gate driver (not illustrated) which supplies gate signals to gate lines and fan-out lines (not illustrated) which connect the display driver 200 and the display area DA.

The sub-area SBA may extend from a side of the main area MA. The sub-area SBA may include a flexible material that can be bent, folded, rolled, etc. For example, in case that the sub-area SBA is bent, it may be overlapped by the main area MA in a thickness direction (Z-axis direction). The sub-area. SBA may include the display driver 200 and a pad unit connected to the circuit board 300. Optionally, the sub-area SBA may be omitted, and the display driver 200 and the pad unit may be disposed in the non-display area NBA.

The display driver 200 may output signals and voltages for driving the display panel 100. The display driver 200 may supply data voltages to data lines. The display driver 200 may supply a power supply voltage to a power line and supply a gate control signal to the gate driver. The display driver 200 may be formed as an integrated circuit and mounted on the display panel 100 by a chip on glass (COG) method, a chip on plastic (COP) method, or an ultrasonic bonding method. For example, the display driver 200 may be disposed in the sub-area SBA and may be overlapped by the main area MA in the thickness direction (Z-axis direction) by the bending of the sub-area SBA. As another example, the display driver 200 may be mounted on the circuit board 300.

The circuit board 300 may be attached onto the pad unit of the display panel 100 using an anisotropic conductive film. Lead lines of the circuit board 300 may be electrically connected to the pad unit of the display panel 100. The circuit board 300 may be a flexible printed circuit board, a printed circuit board, or a flexible film such as a chip on film.

The touch driver 400 may be mounted on the circuit board 300. The touch driver 400 may be connected to a touch sensing unit of the display panel 100. The touch driver 400 may supply a driving signal to a plurality of touch electrodes of the touch sensing unit and sense a change in capacitance between the touch electrodes. For example, the driving signal may be a pulse signal having a frequency. The touch driver 400 may calculate whether an input has been made and input coordinates based on a change in capacitance between the touch electrodes. The touch driver 400 may be formed as an integrated circuit.

Figure 2:
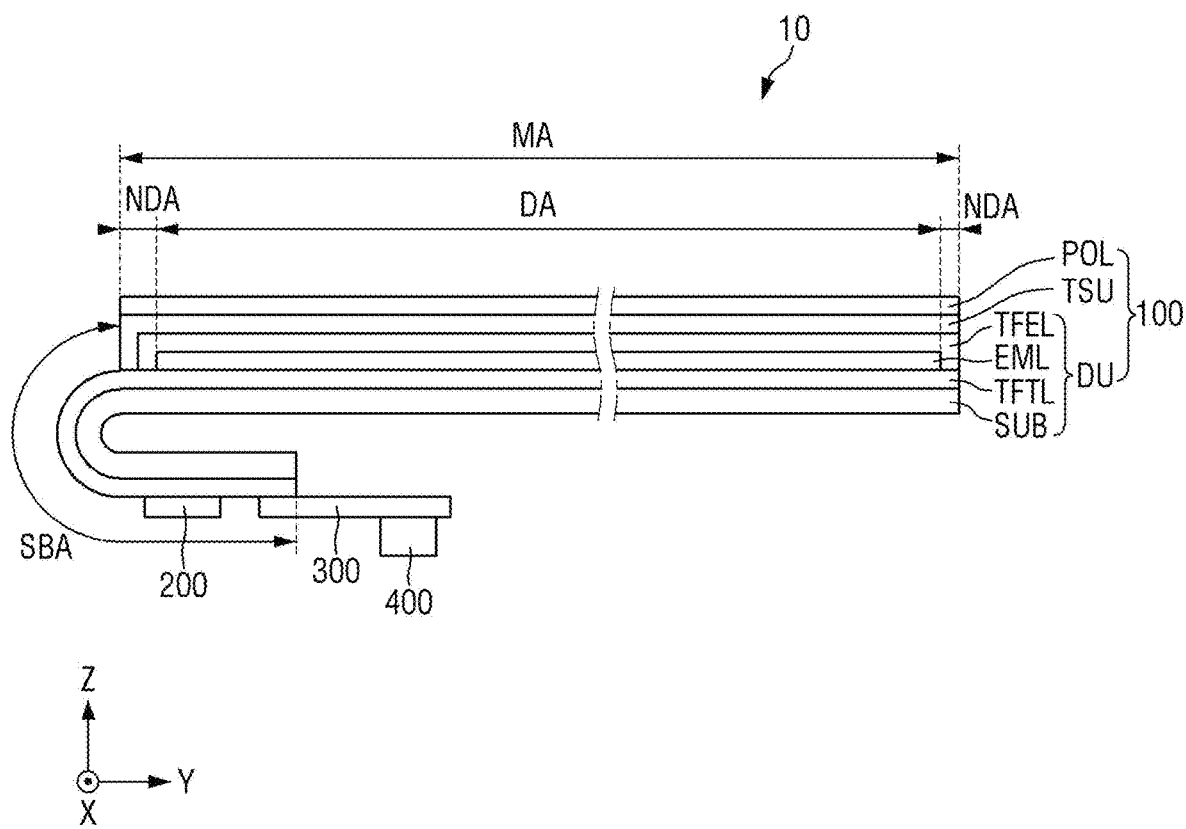
FIG. 2 is a schematic cross-sectional view of the display device according to an embodiment.

FIG. 2 is a schematic cross-sectional view of the display device 10 according to an embodiment.

Referring to FIG. 2, the display panel 100 may include a display unit DU, a touch sensing unit TSU, and a polarizing film POL. The display unit DU may include a substrate SUB, a thin-film transistor layer TFTL, a light emitting element layer EMI, and an encapsulation layer TFEL.

The substrate SUB may be a base substrate or a base part. The substrate SUB may be a flexible substrate that can be bent, folded, rolled, etc. For example, the substrate SUB may include an insulating material such as polymer resin (e.g., polyimide (PI)), but the disclosure is not limited thereto. As another example, the substrate SUB may include a glass material or a metal material.

The thin-film transistor layer TETE may be disposed on the substrate SUB. The thin-film transistor layer TFTL may include a plurality of thin-film transistors constituting pixel circuits of pixels. The thin-film transistor layer TFTL may further include gate lines, data lines, power lines, gate control lines, fan-out lines connecting the display driver 200 and the data lines, and lead lines connecting the display driver 200 and the pad unit. Each of the thin-film transistors may include a semiconductor region, a source electrode, a drain electrode, and a gate electrode. For example, in case that the gate driver is formed on a side of the non-display area NDA of the display panel 100, it may include thin-film transistors.

The thin-film transistor layer TFTL may be disposed in the display area DA, the non-display area NDA, and the sub-area SBA. The thin-film transistors of the pixels, the gate lines, the data lines, and the power lines of the thin-film transistor layer TFTL may be disposed in the display area DA. The gate control lines and the fan-out lines of the thin-film transistor layer TFTL may be disposed in the non-display area NDA. The lead lines of the thin-film transistor layer TFTL may be disposed in the sub-area SBA.

The light emitting element layer EML may be disposed on the thin-film transistor layer TFTL. The light emitting element layer EML, may include light emitting elements, each including a first electrode, a light emitting layer and a second electrode sequentially stacked to emit light, and a pixel defining layer defining the pixels. The light emitting elements of the light emitting element layer EML may be disposed in the display area DA.

For example, the light emitting layer may be an organic light emitting layer including an organic material. The light emitting layer may include a hole transporting layer, an organic light emitting layer, and an electron transporting layer. In case that the first electrode receives a voltage through a thin-film transistor of the thin-film transistor layer TFTL and the second electrode receives a common voltage, holes and electrons may move to the organic light emitting layer through the hole transporting layer and the electron transporting layer, respectively, and may combine together in the organic light emitting layer to emit light. For example, the first electrode may be an anode, and the second electrode may be a cathode, but the disclosure is not limited thereto.

In other embodiments, the light emitting elements may include a quantum dot light emitting diode including a quantum dot light emitting layer, an inorganic light emitting diode including an inorganic semiconductor, or a micro light emitting diode.

The encapsulation layer TFEL may cover upper and side surfaces of the light emitting element layer EML, and may protect the light emitting element layer EML. The encapsulation layer TFEL may include at least one inorganic layer and at least one organic layer to encapsulate the light emitting element layer EML.

The touch sensing unit TSU may be disposed on the encapsulation layer TFEL. The touch sensing unit TSU may include touch electrodes for sensing a user's touch in a capacitive manner and touch lines connecting the touch electrodes and the touch driver 400. For example, the touch sensing unit TSU may sense a user's touch in a mutual capacitance manner or a self-capacitance manner.

In other embodiments, the touch sensing unit TSU may be disposed on a separate substrate disposed on the display unit DU. The substrate supporting the touch sensing unit TSU may be a base part that encapsulates the display unit DU.

The touch electrodes of the touch sensing unit TSU may be disposed in a touch sensor area overlapping the display area DA. The touch lines of the touch sensing unit TSU may be disposed in a touch peripheral area overlapping the non-display area NDA.

The polarizing film POL may be disposed on the touch sensing unit TSU. The polarizing film POL may be attached onto the touch sensing unit TSU by an optically clear adhesive (OCA) film or an optically clear resin (OCR). For example, the polarizing film POL may include a linear polarizer and a retardation film such as a quarter-wave ($\lambda/4$) plate. The retardation film and the linear polarizer may be sequentially stacked on the touch sensing unit TSU.

The sub-area SBA of the display panel 100 may extend from a side of the main area MA. The sub-area SBA may include a flexible material that can be bent, folded, rolled, etc. For example, in case that the sub-area SBA is bent, it may be overlapped by the main area. MA in the thickness direction (Z-axis direction). The sub-area SBA may include the display driver 200 and the pad unit connected to the circuit board 300.

Figure 3:
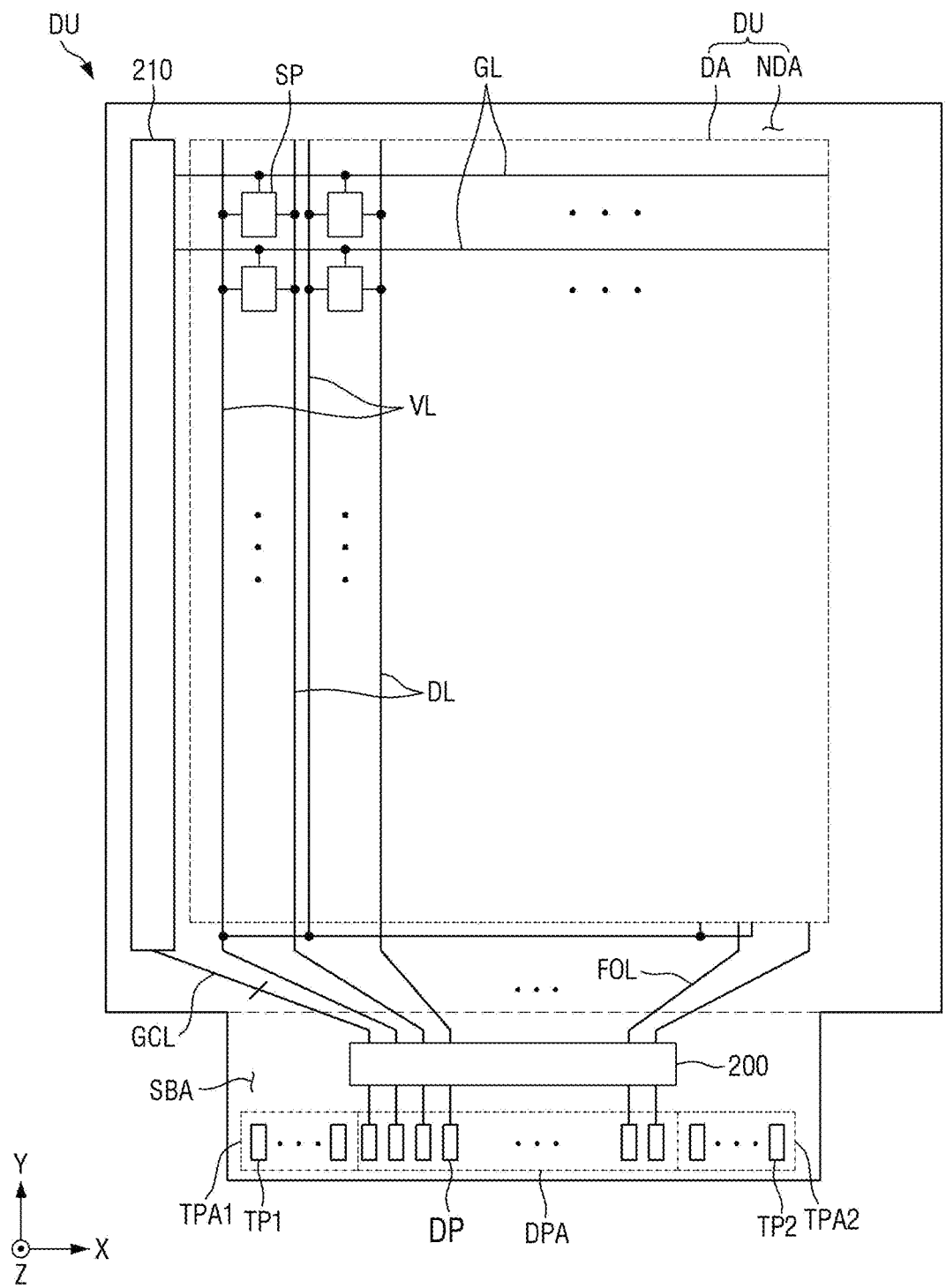
FIG. 3 is a schematic plan view of a display unit of the display device according to an embodiment.

FIG. 3 is a schematic plan view of the display unit DU of the display device 10 according to an embodiment.

Referring to FIG. 3, the display unit DU may include the display area DA and the non-display area NDA.

The display area DA may be an area for displaying an image and may be defined as a central area of the display panel 100. The display area DA may include pixels SP, gate lines GL, data lines DL, and power lines VL. Each of the pixels SP may be defined as a minimum unit that outputs light.

The gate lines GL may supply gate signals received from a gate driver 210 to the pixels SP. The gate lines GL may extend in the X-axis direction and may be spaced apart from each other in the Y-axis direction intersecting the X-axis direction.

The data lines DL may supply data voltages received from the display driver 200 to the pixels SP. The data lines DL may extend in the Y-axis direction and may be spaced apart from each other in the X-axis direction.

The power lines VL may supply a power supply voltage received from the display driver 200 to the pixels SP. Here, the power supply voltage may be at least one of a driving voltage, an initialization voltage, a reference voltage, and a common voltage. The power lines VL may extend in the Y-axis direction and may be spaced apart from each other in the X-axis direction.

The non-display area NDA may surround the display area DA. The non-display area NDA may include the gate driver 210, fan-out lines FOL, and gate control lines GCL. The gate driver 210 may generate a plurality of gate signals based on a gate control signal and sequentially supply the gate signals to the gate lines GL according to a set order.

The fan-out lines FOL may extend from the display driver 200 to the display area DA. The fan-out lines FOL may supply the data voltages received from the display driver 200 to the data lines DL.

The gate control lines GCL may extend from the display driver 200 to the gate driver 210. The gate control lines GCL may supply the gate control signal received from the display driver 200 to the gate driver 210.

The sub-area SBA may include the display driver 200, a display pad area DPA, and first and second touch pad areas TPA1 and TPA2.

The display driver 200 may output signals and voltages for driving the display panel 100 to the fan-out lines FOL. The display driver 200 may supply the data voltages to the data lines DL through the fan-out lines FOL. The data voltages may be supplied to the pixels SP and may determine luminances of the pixels SP. The display driver 200 may supply the gate control signal to the gate driver 210 through the gate control lines GCL.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using a low-resistance high-reliability material such as an anisotropic conductive film or self-assembly anisotropic conductive paste (SAP).

The display pad area DPA may include display pad units DP. The display pad units DP may be connected to a graphics system through the circuit board 300. The display pad units DP may be connected to the circuit board 300 to receive digital video data and may supply the digital video data to the display driver 200.

Figure 4:
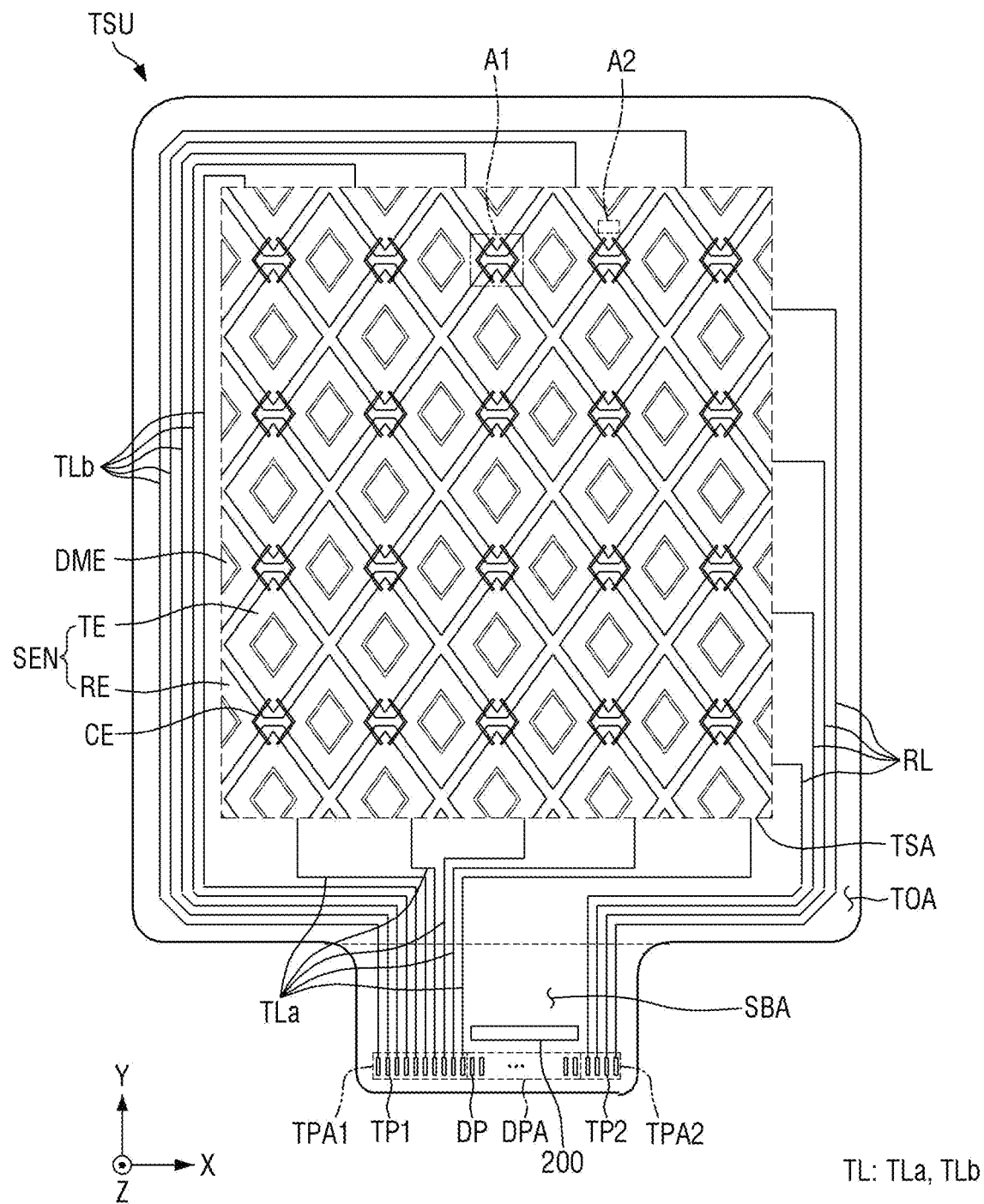
FIG. 4 is a schematic plan view of a touch sensing unit display device according to an embodiment.

FIG. 4 is a schematic plan view of the touch sensing unit TSU of the display device 10 according to an embodiment.

Referring to FIG. 4, the touch sensing unit TSU may include a touch sensor area TSA for sensing a user's touch and a touch peripheral area TOA disposed around the touch sensing area TSA. The touch sensor area TSA may overlap the display area DA of the display unit DU, and the touch peripheral area TOA may overlap the non-display area NDA of the display unit DU.

The touch sensor area TSA may include touch electrodes SEN and dummy electrodes DME. The touch electrodes SEN may form mutual capacitance or self-capacitance to sense a touch of an object or a person. The touch electrodes SEN may be connected to the touch driver 400 through touch lines. The touch electrodes SEN may include driving electrodes TE and sensing electrodes RE. The touch lines may include driving lines TL connected to the driving electrodes TE and sensing lines RL connected to the sensing electrodes RE.

The driving electrodes TE may be arranged in the X-axis direction and the Y-axis direction. The driving electrodes TE may be spaced apart from each other in the X-axis direction and the Y-axis direction. The driving electrodes TE adjacent to each other in the Y-axis direction may be electrically connected through bridge electrodes CE.

The driving electrodes TE may be connected to first touch pad units TP1 through the driving lines TL. The driving lines TL may include lower driving lines TLa and upper driving lines TLb. For example, driving electrodes TE disposed on a lower side of the touch sensor area TSA may be connected to the first touch pad units TP1 through the lower driving lines TLa, and driving electrodes TE disposed on an upper side of the touch sensor area TSA may be connected to the first touch pad units TP1 through the upper driving lines TLb. The lower driving lines TLa may extend to the first touch pad units TN via a lower side of the touch peripheral area. TOA. The upper driving lines TLb may extend to the first touch pad units TP1 via upper, left and lower sides of the touch peripheral area IDA. The first touch pad units TPI may be connected to the touch driver 400 through the circuit board 300.

The bridge electrodes CE may be bent at least once. For example, each of the bridge electrodes CE may be shaped like a bracket ("<" or ">"), but the planar shape of each of the bridge electrodes CE is not limited thereto. The driving electrodes TE adjacent to each other in the Y-axis direction may be connected by a plurality of bridge electrodes CE. Therefore, even if any one of the bridge electrodes CE is broken, the driving electrodes TE may be stably connected through another bridge electrode CE. The driving electrodes TE adjacent to each other may be connected by two bridge electrodes CE, but the number of the bridge electrodes CE is not limited thereto.

The bridge electrodes CE may be disposed on a different layer from the driving electrodes TE and the sensing electrodes RE. The sensing electrodes RE adjacent to each other in the X-axis direction may be electrically connected through a connection part disposed on the same layer as the driving electrodes TE or the sensing electrodes RE. The driving electrodes TE adjacent to each other in the Y-axis direction may be electrically connected through the bridge electrodes CE disposed on a different layer from the driving electrodes TE or the sensing electrodes RE. Therefore, even if the bridge electrodes CE overlap the sensing electrodes RE in the Z-axis direction, the driving electrodes TE and the sensing electrodes RE may be insulated from each other. Mutual capacitance may be formed between the driving electrodes TE and the sensing electrodes RE.

The sensing electrodes RE may extend in the X-axis direction and may be spaced apart from each other in the Y-axis direction. The sensing electrodes RE may be arranged in the X-axis direction and the Y-axis direction, and the sensing electrodes RE adjacent to each other in the X-axis direction may be electrically connected through a connection part.

The sensing electrodes RE may be connected to second touch pad units TP2 through the sensing lines RL. For example, sensing electrodes RE disposed on a right side of the touch sensor area TSA may be connected to the second touch pad units TP2 through the sensing lines RL. The sensing lines RL may extend to the second touch pad units TP2 via the right and lower sides of the touch peripheral area TOA. The second touch pad units TP2 may be connected to the touch driver 400 through the circuit board 300.

Each of the dummy electrodes DME may be surrounded by a driving electrode TE or a sensing electrode RE. Each of the dummy electrodes DME may be spaced apart and insulated from the driving electrode TE or the sensing electrode RE. Therefore, the dummy electrodes DME may be electrically floating. Optically, the dummy electrodes DME may be omitted.

The display pad area DPA, the first touch pad area TPA1, and the second touch pad area TPA2 may be disposed at an edge of the sub-area SBA. The display pad area DPA, the first touch pad area TPA1 and the second touch pad area TPA2 may be electrically connected to the circuit board 300 using a low-resistance high-reliability material such as an anisotropic conductive film or self-assembly anisotropic conductive paste (SAP).

The first touch pad area TPA1 may be disposed on a side of the display pad area DPA and may include first touch pad units TP1. The first touch pad units TP1 may be electrically connected to the touch driver 400 disposed on the circuit board 300. The first touch pad units TP1 may supply a driving signal to the driving electrodes TE through the driving lines TL.

The second touch pad area TPA2 may be disposed on another side of the display pad area DPA and may include second touch pad units TP2. The second touch pad units TP2 may be electrically connected to the touch driver 400 disposed on the circuit board 300. The touch driver 400 may receive a sensing signal through the sensing lines RL connected to the second touch pad units TP2 and sense a change in mutual capacitance between the driving electrodes TE and the sensing electrodes RE.

In other embodiments, the touch driver 400 may supply a driving signal to each of the driving electrodes TE and the sensing electrodes RE and receive a sensing signal from each of the driving electrodes TE and the sensing electrodes RE. The touch driver 400 may sense the amount of charge change in each of the driving electrodes TE and the sensing electrodes RE based on the sensing signal.

Figure 5:
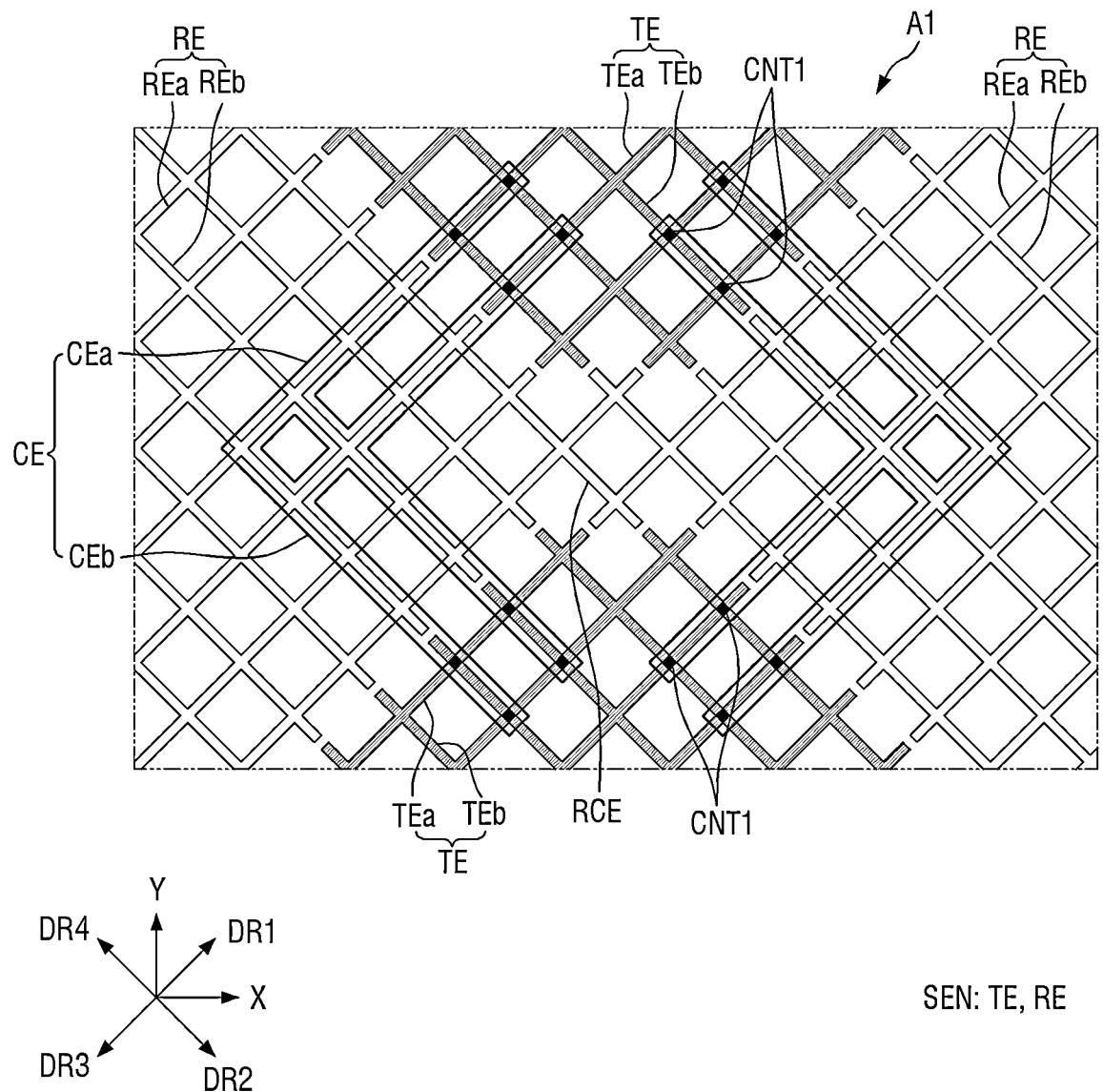
FIG. 5 is an enlarged schematic view of area A1 of FIG. 4.

FIG. 5 is an enlarged schematic view of area A1 of FIG. 4.

Referring to FIG. 5, the touch sensing unit TSU may include the touch electrodes SEN and the dummy electrodes DME. The driving electrodes TE, the sensing electrodes RE, and the dummy electrodes DME may be disposed on the same layer and may be spaced apart from each other.

The driving electrodes TE may be arranged in the X-axis direction and the Y-axis direction. The driving electrodes TE may be spaced apart from each other in the X-axis direction and the Y-axis direction. The driving electrodes TE adjacent to each other in the Y-axis direction may be electrically connected through the bridge electrodes CE.

The sensing electrodes RE may extend in the X-axis direction and may be spaced apart from each other in the Y-axis direction. The sensing electrodes RE may be arranged in the X-axis direction and the Y-axis direction, and the sensing electrodes RE adjacent to each other in the X-axis direction may be electrically connected through a connection part RCE. For example, the connection part RCE of the sensing electrodes RE may be disposed within a shortest distance between the driving electrodes TE adjacent to each other.

The bridge electrodes CE may be disposed on a different layer from the driving electrodes TE and the sensing electrodes RE. Each of the bridge electrodes CE may include a first part CEa and a second part CEb. For example, the first part CEa of each of the bridge electrodes CE may be connected to a driving electrode TE disposed on a side through first contact holes CNT1 and may extend in a third direction DR3. The second part CEb of each of the bridge electrodes CE may be bent from the first part CEa in an area overlapping a sensing electrode RE and may extend in a second direction DR2. The second part CEb may be connected to a driving electrode TE disposed on another side through first contact holes CNT1. In the following description, a first direction DR1 may be a direction between the X-axis direction and the Y-axis direction, the second direction DR2 may be a direction between a direction opposite to the Y-axis direction and the X-axis direction, the third direction DR3 may be a direction opposite to the first direction DR1, and a fourth direction DR4 may be a direction opposite to the second direction DR2. Therefore, each of the bridge electrodes CE may connect the driving electrodes TE adjacent to each other in the Y-axis direction.

Each of the driving electrodes TE may include a first part TEa extending in the first direction DR1 and a second part TEb extending in the second direction DR2. Each of the sensing electrodes RE may include a first part REa extending in the first direction DR1 and a second part REb extending in the second direction DR2.

Figure 6:
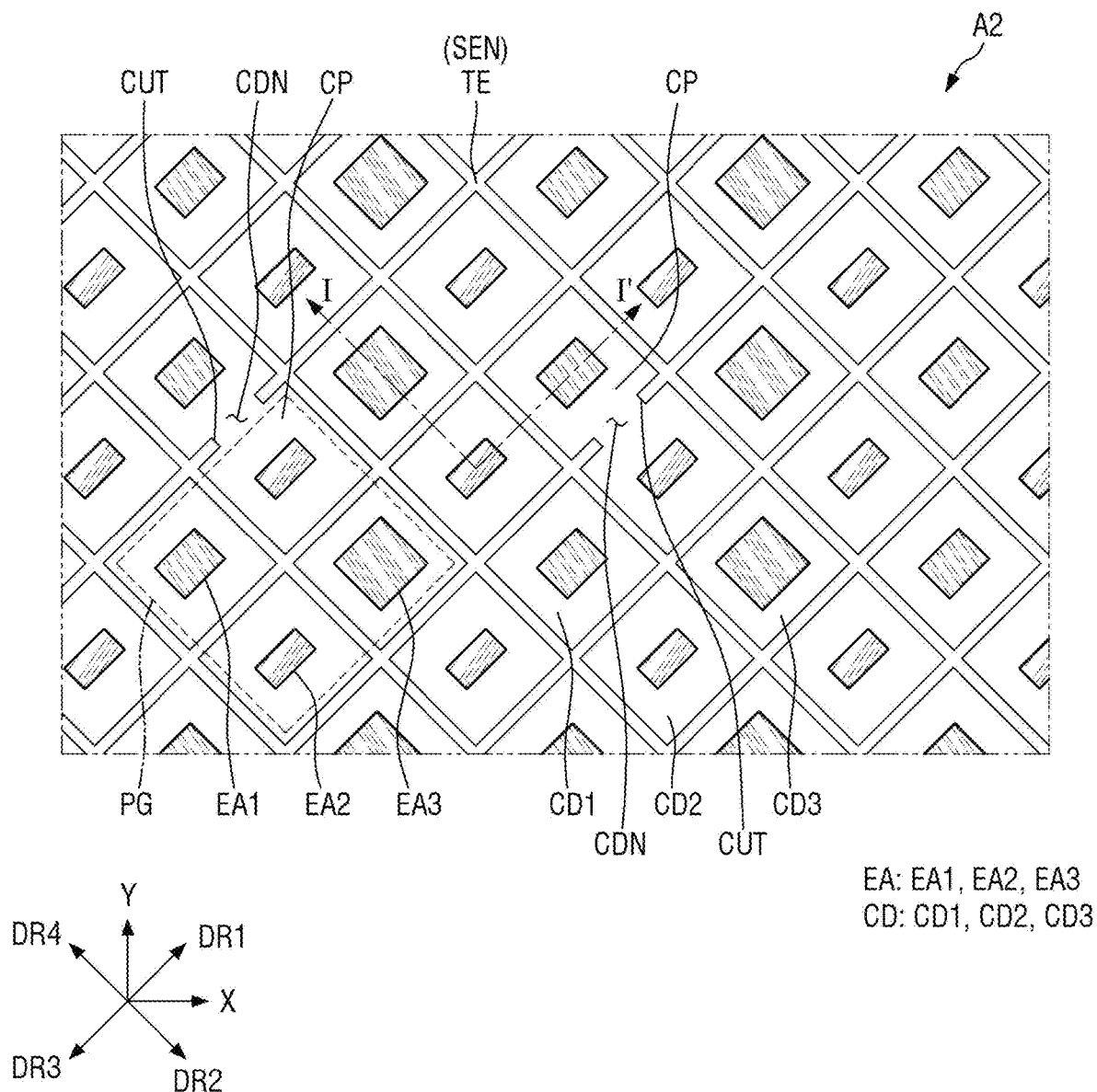
FIG. 6 is an enlarged schematic view of an example of area A2 of FIG. 4.
Figure 7:
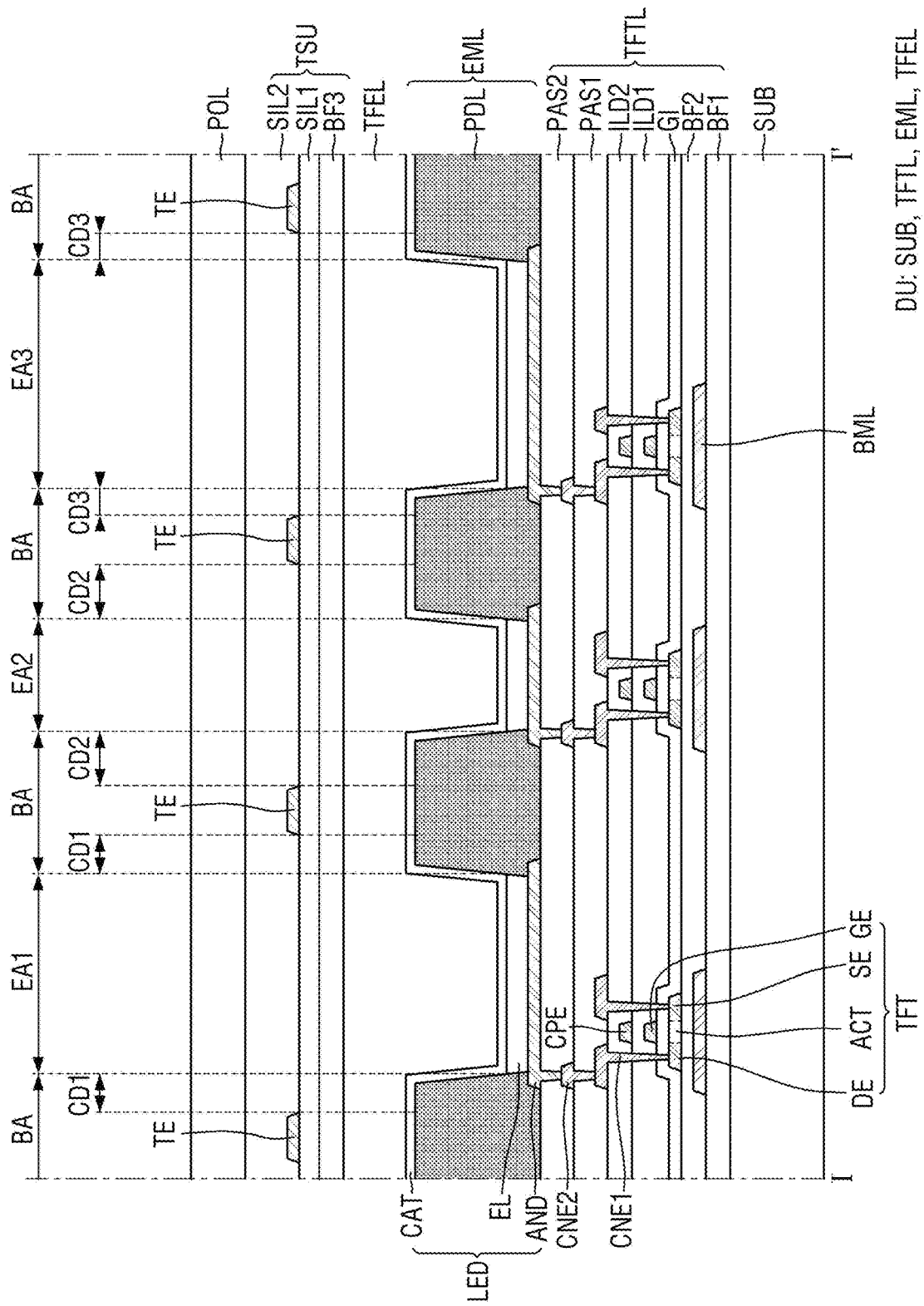
FIG. 7 is a schematic cross-sectional view taken along line I-I' of FIG. 6.

FIG. 6 is an enlarged schematic view of an example of area A2 of FIG. 4. FIG. 7 is a schematic cross-sectional view taken along line I-I' of FIG. 6.

Referring to FIGS. 6 and 7, the touch sensing unit TSU may include the touch electrodes SEN and the dummy electrodes DME. The driving electrodes TE, the sensing electrodes RE, and the dummy electrodes DME may be disposed on the same layer and may be spaced apart from each other.

For example, the driving electrodes TE, the sensing electrode RE, and the dummy electrodes DME may be formed in a mesh structure or a net structure in plan view. The driving electrodes TE, the sensing electrodes RE, and the dummy electrodes DME may surround each of first through third emission areas EA1 through EA3 of each pixel group PG in plan view. Therefore, the driving electrodes TE, the sensing electrodes RE, and the dummy electrodes DME may not overlap the first through third emission areas EA1 through EA3. The bridge electrodes CE may also not overlap the first through third emission areas EA1 through EA3. Therefore, the display device 10 can prevent the luminance of light emitted from the first through third emission areas EA1 through EA3 from being reduced by the touch sensing unit TSU.

Pixels may include first through third subpixels, and each of the first through third subpixels may include the first through third emission areas EA1 through EA3. The first emission area EA1 may emit light of a first color or red light, the second emission area EA2 may emit light of a second color or green light, and the third emission area EA3 may emit light of a third color or blue light, but the disclosure is not limited thereto. The areas of the first through third emission areas EA1 through EA3 may be different from each other. For example, the area of the third emission area EA3 may be larger than the area of the first emission area EA1, and the area of the first emission area EA1 may be larger than the area of the second emission area EA2, but the disclosure is not limited thereto. As another example, the areas of the first through third emission areas EA1 through EA3 may be substantially the same.

A pixel group PG may include one first emission area EA1, two second emission areas EA2, and one third emission area EA3 to express a white gray level. However, the configuration of the pixel group PG is not limited thereto. Light emitted from one first emission area EA1, light emitted from two second emission areas EA2, and light emitted from one third emission area EA3 may combine to express the white gray level.

The display panel 100 may include the display unit DU, the touch sensing unit TSU, and the polarizing film POL. The display unit DU may include the substrate SUB, the thin-film transistor layer TFTL, the light emitting element layer EML, and the encapsulation layer TFEL.

The substrate SUB may be a base substrate or a base part. The substrate SUB may be a flexible substrate that can be bent, folded, rolled, etc. For example, the substrate SUB may include an insulating material such as polymer resin (e.g., polyimide (PI)), but the disclosure is not limited thereto. As another example, the substrate SUB may include a glass material or a metal material.

The thin-film transistor layer TFTL may include a first buffer layer BF1, light blocking layers BML, a second buffer layer BF2, thin-film transistors TFT, a gate insulating layer GI, a first interlayer insulating film ILD1, capacitor electrodes CPE, a second interlayer insulating film ILD2, first connection electrodes CNE1, a first passivation layer PAS1, second connection electrodes CNE2, and a second passivation layer PAS2.

The first buffer layer BF1 may be disposed on the substrate SUB. The first buffer layer BF1 may include an inorganic layer that can prevent penetration of air or moisture. For example, the first buffer layer BF1 may include multiple inorganic layers stacked alternately.

The light blocking layers BML may be disposed on the first buffer layer BF1. For example, each of the light blocking layers BML may be a single layer or a multilayer made of any one or more of molybdenum (Mo), aluminum (Al), chromium (Cr), gold (Au), titanium (Ti), nickel (Ti), neodymium (Nd), copper (Cu), and alloys of the same. As another example, each of the light blocking layers BML may be an organic layer including a black pigment.

The second buffer layer BF2 may cover the first buffer layer BF1 and the light blocking layers BML. The second buffer layer BF2 may include an inorganic layer that can prevent penetration of air or moisture. For example, the second buffer layer BF2 may include a plurality of inorganic layers stacked alternately.

The thin-film transistors TFT may be disposed on the second buffer layer BF2 and may constitute respective pixel circuits of the pixels. For example, each of the thin-film transistors TFT may be a driving transistor or a switching transistor of a pixel circuit. Each of the thin-film transistors TFT may include a semiconductor region ACT, a source electrode SE, a drain electrode DE, and a gate electrode GE.

The semiconductor region ACT, the source electrode SE, and the drain electrode DE may be disposed on the second buffer layer BF2. The semiconductor region ACT, the source electrode SE, and the drain electrode DE may overlap a light blocking layer BML in the thickness direction. The semiconductor region ACT may be overlapped by the gate electrode GE in the thickness direction and may be insulated from the gate electrode GE by the gate insulating layer GI. The source electrode SE and the drain electrode DE may be formed by making the material of the semiconductor region ACT conductive.

The gate electrode GE may be disposed on the gate insulating layer GI. The gate electrode GE may overlap the semiconductor region ACT with the gate insulating layer GI interposed between the gate electrode GE and the semiconductor region ACT.

The gate insulating layer GI may be disposed on the semiconductor regions ACT, the source electrodes SE, and the drain electrodes DE. For example, the gate insulating layer GI may cover the semiconductor regions ACT, the source electrodes SE, the drain electrodes DE and the second buffer layer BF2 and may insulate the semiconductor regions ACT from the gate electrodes GE. The gate insulating layer GI may include contact holes through which the first connection electrodes CNE1 pass.

The first interlayer insulating film ILD1 may cover the gate electrodes GE and the gate insulating layer GI. The first interlayer insulating film ILD1 may include contact holes through which the first connection electrodes CNE1 pass. The contact holes of the first interlayer insulating film ILD1 may be connected to the contact holes of the gate insulating layer GI and contact holes of the second interlayer insulating film ILD2.

The capacitor electrodes CPE may be disposed on the first interlayer insulating film ILD1. The capacitor electrodes CPE may overlap the gate electrodes GE in the thickness direction. The capacitor electrodes CPE and the gate electrodes GE may form capacitances.

The second interlayer insulating film ILD2 may cover the capacitor electrodes CPE and the first interlayer insulating film ILD1. The second interlayer insulating film ILD2 may include the contact holes through which the first connection electrodes CNE1 pass. The contact holes of the second interlayer insulating film ILD2 may be connected to the contact holes of the first interlayer insulating film ILD1 and the contact holes of the gate insulating layer GI.

The first connection electrodes CNE1 may be disposed on the second interlayer insulating film ILD2. The first connection electrodes CNE1 may connect the drain electrodes DE of the thin-film transistors TFT to the second connection electrodes CNE2. The first connection electrodes CNE1 may be inserted into the contact holes provided in the second interlayer insulating film ILD2, the first interlayer insulating film ILD1 and the gate insulating layer GI to contact the drain electrodes DE of the thin-film transistors TFT.

The first passivation layer PAS1 may cover the first connection electrodes CNE1 and the second interlayer insulating film ILD2. The first passivation layer PAS1 may protect the thin-film transistors TFT. The first passivation layer PAST may include contact holes through which the second connection electrodes CNE2 pass.

The second connection electrodes CNE2 may be disposed on the first passivation layer PAS1. The second connection electrodes CNE2 may connect the first connection electrodes CNE1 to pixel electrodes AND of light emitting elements LED. The second connection electrodes CNE2 may be inserted into the contact holes provided in the first passivation layer PAS1 to contact the first connection electrodes CNE1.

The second passivation layer PAS2 may cover the second connection electrodes CNE2 and the first passivation layer PAS1. The second passivation layer PAS2 may include contact holes through which the pixel electrodes AND of the light emitting elements LED pass.

The light emitting element layer EML may be disposed on the thin-film transistor layer TFTL. The light emitting element layer may include the light emitting elements LED and a pixel defining layer PDL. Each of the light emitting elements LED may include the pixel electrode AND, a light emitting layer EL, and a common electrode CAT.

The pixel electrode AND may be disposed on the second passivation layer PAS2. The pixel electrode AND may overlap at least one of the first through third emission areas EA1 through EA3 defined by the pixel defining layer PDL. The pixel electrode AND may be connected to the drain electrode DE of each thin-film transistor TFT through the first and second connection electrodes CNE1 and CNE2.

The pixel electrode AND may reflect light of a specific wavelength. The pixel electrode AND may reflect infrared light or ultraviolet light. The pixel electrode AND may include an infrared reflective material or an ultraviolet reflective material. For example, the pixel electrode AND may include at least one of silver (Ag), copper (Cu), aluminum (Al), nickel (Ni), and lanthanum (La). As another example, the pixel electrode AND may include a material such as indium tin oxide (ITO), indium zinc oxide (IZO), indium tin zinc oxide (ITZO), or a combination thereof. As another example, the pixel electrode AND may include a transparent conductive material layer and a metal layer having high reflectivity or may include a single layer including a transparent conductive material and a metal having high reflectivity. The pixel electrode AND may have a stacked structure of ITO/Ag/ITO, ITO/Ag/IZO, or ITO/Ag/ITZO/IZO.

The light emitting layer EL may be disposed on the pixel electrode AND. For example, the light emitting layer EL may be, but is not limited to, an organic light emitting layer made of an organic material. In case that the light emitting layer EL is an organic light emitting layer, if a thin-film transistor TFT applies a voltage to the pixel electrode AND of a light emitting element LED and the common electrode CAT of the light emitting element LED receives a common voltage or a cathode voltage, holes and electrons may move to the light emitting layer EL through a hole transporting layer and an electron transporting layer, respectively, and may combine together in the light emitting layer EL to emit light.

The common electrode CAT may be disposed on the light emitting layer EL. For example, the common electrode CAT may be implemented as an electrode common to pixels without distinction between the pixels. The common electrode CAT may be disposed on the light emitting layers EL in the first through third emission areas EA1 through EA3 and may be disposed on the pixel defining layer PDL in an area excluding the first through third emission areas EA1 through EA3. The common electrode CAT may receive a common voltage or a low-potential voltage. In case that the pixel electrode AND receives a voltage corresponding to a data voltage and the common electrode CAT receives a low-potential voltage, a potential difference may be formed between the pixel electrode AND and the common electrode CAT so that the light emitting layer EL emits light. The common electrode CAT may transmit light of a specific wavelength. The common electrode CAT may transmit infrared light or ultraviolet light.

The pixel defining layer PDL may define the first through third emission areas EA1 through EA3. The pixel defining layer PDL may separate and insulate the respective pixel electrodes AND of the light emitting elements LED from each other. The pixel defining layer PDL may absorb light of a specific wavelength. The pixel defining layer PDL may include an infrared absorbing material or an ultraviolet absorbing material. For example, the pixel defining layer PDL may include, but is not limited to, at least one of a diimmonium compound, a polymethine compound, an anthraquinone compound, and a phthalocyanine compound. Therefore, in case that a camera photographs the pixel defining layer PDL using infrared light or ultraviolet light, the pixel defining layer PDL absorbing the infrared light or the ultraviolet light may be distinguished from the pixel electrodes AND and the touch electrodes SEN reflecting the infrared light or the ultraviolet light.

For example, the transmittance of the pixel defining layer PDL for light of a specific wavelength may be about 15% or less. Here, the light of the specific wavelength may have a wavelength of, but is not limited to, about 800 nm to about 900 nm. An input device such as an input pen may photograph the pixel defining layer PDL using infrared light having a wavelength of about 800 nm to about 900 nm. In case that the transmittance of the pixel defining layer PDL for the light of the specific wavelength is about 15% or less, the pixel defining layer PDL may be clearly distinguished from the pixel electrodes AND and the touch electrodes SEN reflecting the light of the specific wavelength. In case that the transmittance of the pixel defining layer PDL for the light of the specific wavelength exceeds about 15%, the pixel defining layer PDL may not be clearly distinguished from the pixel electrodes AND and the touch electrodes SEN reflecting the light of the specific wavelength, and the discrimination power of the input device may be reduced. Therefore, the display device 10 may include the pixel defining layer PDL having a transmittance of about 15% or less for light having a wavelength of about 800 nm to about 900 nm. Accordingly, an input device such as an input pen can readily identify a code CD formed of the planar shape of the pixel defining layer PDL, and a sensing system can improve the sensing sensitivity of the input device.

The pixel defining layer PDL may include codes CD distinguished from the pixel electrodes AND and the touch electrodes SEN. A part of each pixel electrode AND may be disposed in an emission area EA, and another part of the pixel electrode AND may be covered by the pixel defining layer PDL. Therefore, the pixel electrode AND disposed in the emission area EA may be exposed to light of a specific wavelength and may reflect the light of the specific wavelength incident to the emission area EA. Each of the codes CD may surround the emission area. EA in plan view and may be surrounded by a touch electrode SEN. Therefore, each of the codes CD may correspond to an area between the emission area EA and the touch electrode SEN.

The codes CD may include first through third codes CD1 through CD3. The first code CD1 may surround the first emission area EA1 and may be surrounded by a touch electrode SEN. The second code CD2 may surround the second emission area. EA2 and may be surrounded by the touch electrode SEN. The third code CD3 may surround the third emission area EA3 and may be surrounded by the touch electrode SEN. The areas of the first through third emission areas EA1 through EA3 may be different from each other. For example, the area of the third emission area EA3 may be larger than the area of the first emission area EA1, and the area of the first emission area EA1 may be larger than the area of the second emission area EA2. The area of the second code CD2 may be larger than the area of the first code CD1, and the area of the first code CD1 may be larger than the area of the third code CD3. Therefore, the first through third codes CD1 through CD3 may be distinguished by their size and shape.

A code pattern CP may include adjacent codes CD among the first through third codes CD1 through CD3 and a code connection part CDN. The code connection part CDN may connect adjacent codes CD among the first through third codes CD1 through CD3. The code connection part CDN may be exposed to light of a specific wavelength by a cut part CUT of the touch electrode SEN. Therefore, the code pattern CP formed of a combination of adjacent codes CD and the code connection part CDN may have various shapes and sizes. For example, the code pattern CP may include the first and second codes CD1 and CD2 adjacent to each other and the code connection part CDN connecting the first and second codes CD1 and CD2.

Code patterns CP may be disposed over the entire display area DA, and each of the code patterns CP may have position information according to specific criteria. The code patterns CP may be photographed by a camera approaching the front of the display device 10 and may be identified through a photographed video or image. At least one code pattern CP or a combination of code patterns CP may correspond to values of preset data codes. For example, a code pattern CP disposed at a specific position may correspond to a data code designated at that position.

Since the display device 10 may include the pixel defining layer PDL distinguished from the pixel electrodes AND and the touch electrodes SEN and the code patterns CP determined (defined) by the planar shape of the pixel defining layer PDL, it may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, it can be applied to many electronic devices having a touch function without being limited by size.

The encapsulation layer TFEL may be disposed on the common electrode CAT to cover the light emitting elements LED. The encapsulation layer TFEL, may include at least one inorganic layer to prevent oxygen or moisture from penetrating into the light emitting element layer EML. The encapsulation layer TFEL may include at least one organic layer to protect the light emitting element layer EML from foreign substances such as dust.

The touch sensing unit TSU may be disposed on the encapsulation layer TFEL. The touch sensing unit TSU may include a third buffer layer BF3, the bridge electrodes CE, a first insulating layer SIL1, the touch electrodes SEN, and a second insulating layer SIL2.

The third buffer layer BF3 may be disposed on the encapsulation layer TFEL. The third buffer layer BF3 may have insulating and optical functions. The third buffer layer BF3 may include at least one inorganic layer. Optionally, the third buffer layer BF3 may be omitted.

The bridge electrodes CE may be disposed on the third buffer layer BF3. The bridge electrodes CE may be disposed on a different layer from the driving electrodes TE and the sensing electrodes RE and may connect the driving electrodes TE adjacent to each other in the Y-axis direction.

The first insulating layer SIL1 may cover the bridge electrodes CE and the third buffer layer BF3. The first insulating layer SIL1 may have insulating and optical functions. For example, the first insulating layer SIL1 may be an inorganic layer including at least one of a silicon nitride layer, a silicon oxynitride layer, a silicon oxide layer, a titanium oxide layer, and an aluminum oxide layer.

The touch electrodes SEN may include the driving electrodes TE and the sensing electrodes RE. The driving electrodes TE and the sensing electrodes RE may be disposed on the first insulating layer SIL1. Each of the driving electrodes TE and the sensing electrodes RE may not overlap the first through third emission areas EA1 through EA3.

The touch electrodes SEN may reflect light of a specific wavelength. The touch electrodes SEN may reflect infrared light or ultraviolet light. The touch electrodes SEN may include an infrared reflective material or an ultraviolet reflective material. Each of the touch electrodes SEN may be formed of a single layer of molybdenum (Mo), titanium (Ti), copper (Cu), aluminum (Al), indium tin oxide (ITO), or a combination thereof, or may be formed of a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide.

The second insulating layer SIL2 may cover the touch electrodes SEN and the first insulating layer SIL1. The second insulating layer SIL2 may have insulating and optical functions. The second insulating layer SIL2 may be made of at least one of the example materials of the first insulating layer SIL1.

The polarizing film POL may be disposed on the touch sensing unit TSU. The polarizing film POL, may be attached onto the touch sensing unit TSU by an OCA film or an OCR. For example, the polarizing film POL may include a linear polarizer and a retardation film such as a λ/4 plate. The retardation film and the linear polarizer may be sequentially stacked on the touch sensing unit TSU.

Figure 8:
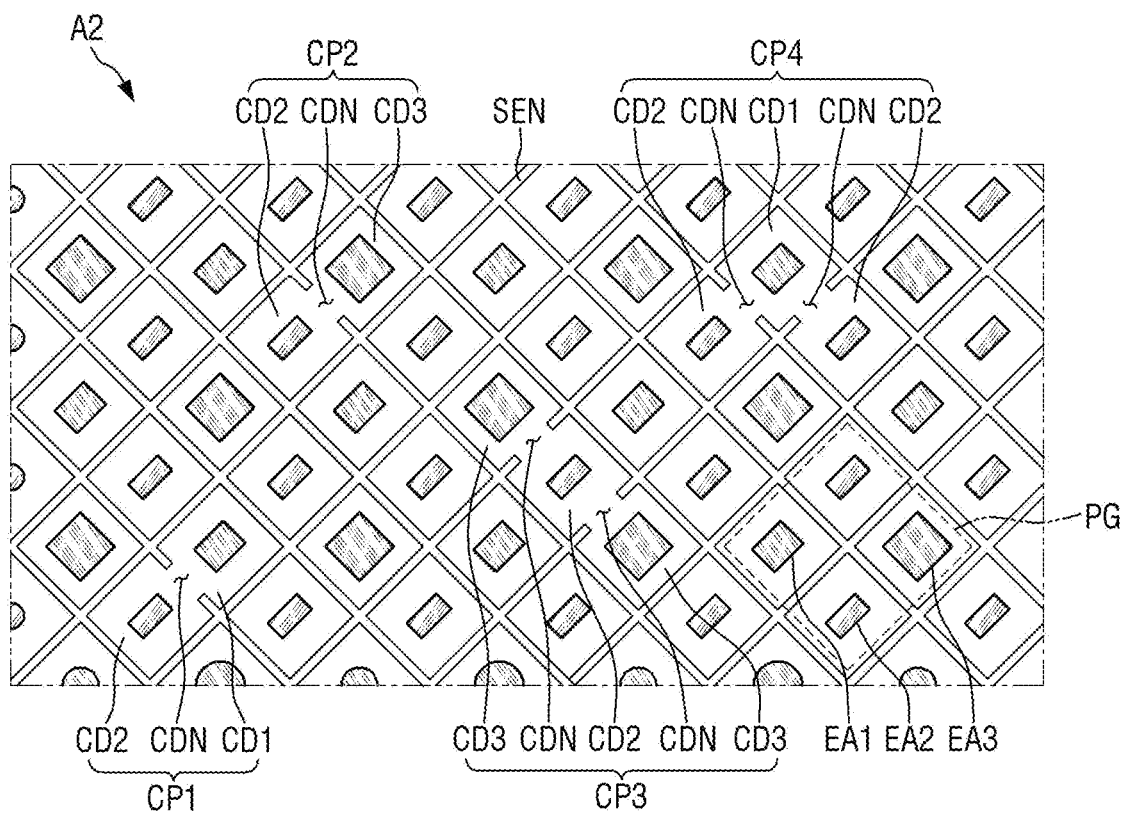
FIG. 8 is an enlarged schematic view of another example of area A2 of FIG. 4.
Figure 8:
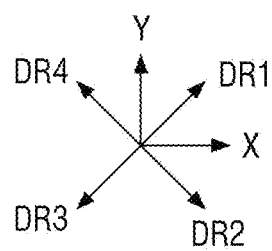

FIG. 8 is an enlarged schematic view of another example of area A2 of FIG. 4.

Referring to FIG. 8, codes CD may include first through third codes CD1 through CD3. The first code CD1 may surround a first emission area EA1 and may be surrounded by a touch electrode SEN. The second code CD2 may surround a second emission area EA2 and may be surrounded by the touch electrode SEN. The third code CD3 may surround a third emission area EA3 and may be surrounded by the touch electrode SEN. For example, the area of the third emission area EA3 may be larger than the area of the first emission area EA1, and the area of the first emission area EA1 may be larger than the area of the second emission area EA2. The area of the second code CD2 may be larger than the area of the first code CD1, and the area of the first code CD1 may be larger than the area of the third code CD3. Therefore, the first through third codes CD1 through CD3 may be distinguished by their size and shape.

A code pattern CP may include adjacent codes CD among the first through third codes CD1 through CD3 and a code connection part CDN. The code connection part CDN may connect adjacent codes CD among the first through third codes CD1 through CD3. The code connection part CDN may be exposed to light of a specific wavelength by a cut part CUT of the touch electrode SEN. Therefore, the code pattern CP formed of a combination of adjacent codes CD and the code connection part CDN may have various shapes and sizes.

A first code pattern CP1 may include the first code CD1, the second code CD2 adjacent to the first code CD1 in the third direction DR3, and the code connection part CDN connecting the first and second codes CD1 and CD2. Therefore, the first code pattern CP1 may be formed by connecting two codes CD connected in a line.

A second code pattern CP2 may include the second code CD2, the third code CD3 adjacent to the second code CD2 in the first direction DR1, and the code connection part CDN connecting the second and third codes CD2 and CD3. Therefore, the second code pattern CP2 may be formed by connecting two codes CD connected in a line.

A third code pattern CP3 may include the third code CD3, the second code CD2 adjacent to the third code CD3 in the second direction DR2, the third code CD3 adjacent to the second code CD2 in the second direction DR2, and the code connection parts CDN connecting the second and third codes CD2 and CD3. Therefore, the third code pattern CP3 may be formed by connecting three codes CD connected in a line.

A fourth code pattern CP4 may include the second code CD2, the first code CD1 adjacent to the second code CD2 in the first direction DR1, the second code CD2 adjacent to the first code CD1 in the second direction DR2, and the code connection parts CDN connecting the first and second codes CD1 and CD2. Therefore, the fourth code pattern CP4 may be formed by connecting three codes CD disposed in a "A" shape.

Code patterns CP may be disposed over the entire display area DA, and each of the code patterns CP may have position information according to specific criteria. The code patterns CP may be photographed by a camera approaching the front of the display device 10 and may be identified through a photographed video or image. At least one code pattern CP or a combination of code patterns CP may correspond to values of preset data codes. For example, a code pattern CP disposed at a specific position may correspond to a data code designated at that position.

Figure 9:
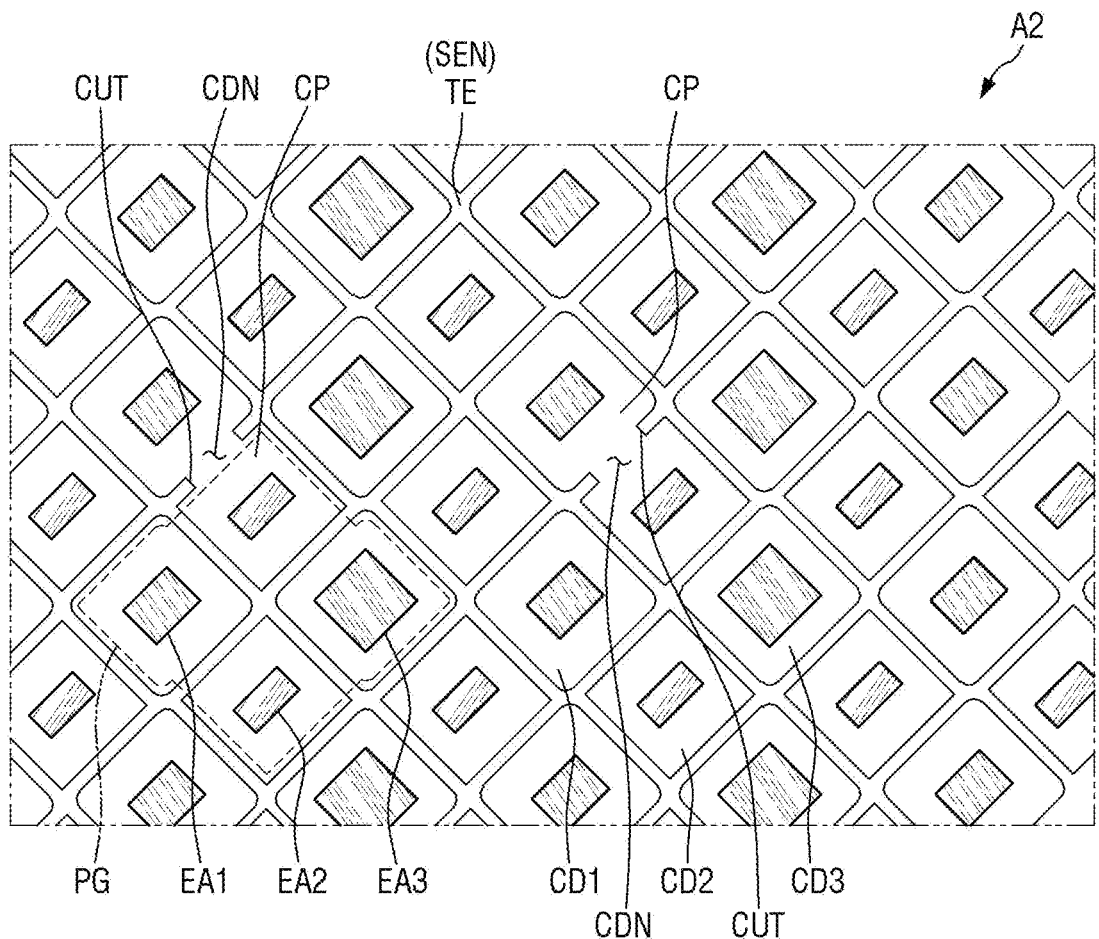
FIG. 9 is an enlarged schematic view of another example of area A2 of FIG. 4.

FIG. 9 is an enlarged schematic view of another example of area A2 of FIG. 4. A display device of FIG. 9 may be different from the display device of FIG. 6 at least in the configuration of a touch electrode SEN. Therefore, the same configurations as those described above will be briefly described or will not be described.

Referring to FIG. 9, first through third emission areas EA1 through EA3 may have different sizes. For example, the size of the third emission area EA3 may be larger than the size of the first emission area EA1, and the size of the first emission area EA1 may be larger than the size of the second emission area EA2. However, the disclosure is not limited thereto.

The touch electrode SEN may be formed in a mesh structure or a net structure in plan view. The touch electrode SEN may surround each of the first through third emission areas EA1 through EA3 of each pixel group PG in plan view. Therefore, the touch electrode SEN surrounding each of the first through third emission areas EA1 through EA3 may have a different circumference. For example, the circumference of the touch electrode SEN surrounding the third emission area EA3 may be greater than the circumference of the touch electrode SEN surrounding the first emission area EA1, and the circumference of the touch electrode SEN surrounding the first emission area EA1 may be greater than the circumference of the touch electrode SEN surrounding the second emission area EA2. Therefore, the shape of the touch electrode SEN may correspond to the size of each of the first through third emission areas EA1 through EA3.

A pixel defining layer PDL may include codes CD distinguished from pixel electrodes AND and the touch electrode SEN. A part of each pixel electrode AND may be disposed in an emission area EA, and another part of the pixel electrode AND may be covered by the pixel defining layer PDL. Therefore, the pixel electrode AND disposed in the emission area EA may be exposed to light of a specific wavelength and may reflect the light of the specific wavelength incident to the emission area EA. Each of the codes CD may surround the emission area EA in plan view and may be surrounded by the touch electrode SEN. Therefore, each of the codes CD may correspond to an area between the emission area EA and the touch electrode SEN.

The codes CD may include first through third codes CD1 through CD3. The first code CD1 may surround the first emission area EA1 and may be surrounded by the touch electrode SEN. The second code CD2 may surround the second emission area EA2 and may be surrounded by the touch electrode SEN. The third code CD3 may surround the third emission area EA3 and may be surrounded by the touch electrode SEN. Since the circumference of the touch electrode SEN surrounding each of the first through third emission areas EA1 through EA3 may be different and the respective areas of the first through third emission areas EA1 through EA3 may be different, the areas of the first through third codes CD1 through CD3 may be different from each other. Therefore, the first through third codes CD1 through CD3 may be distinguished by their size and shape and may have position information according to their shape.

Figure 10:
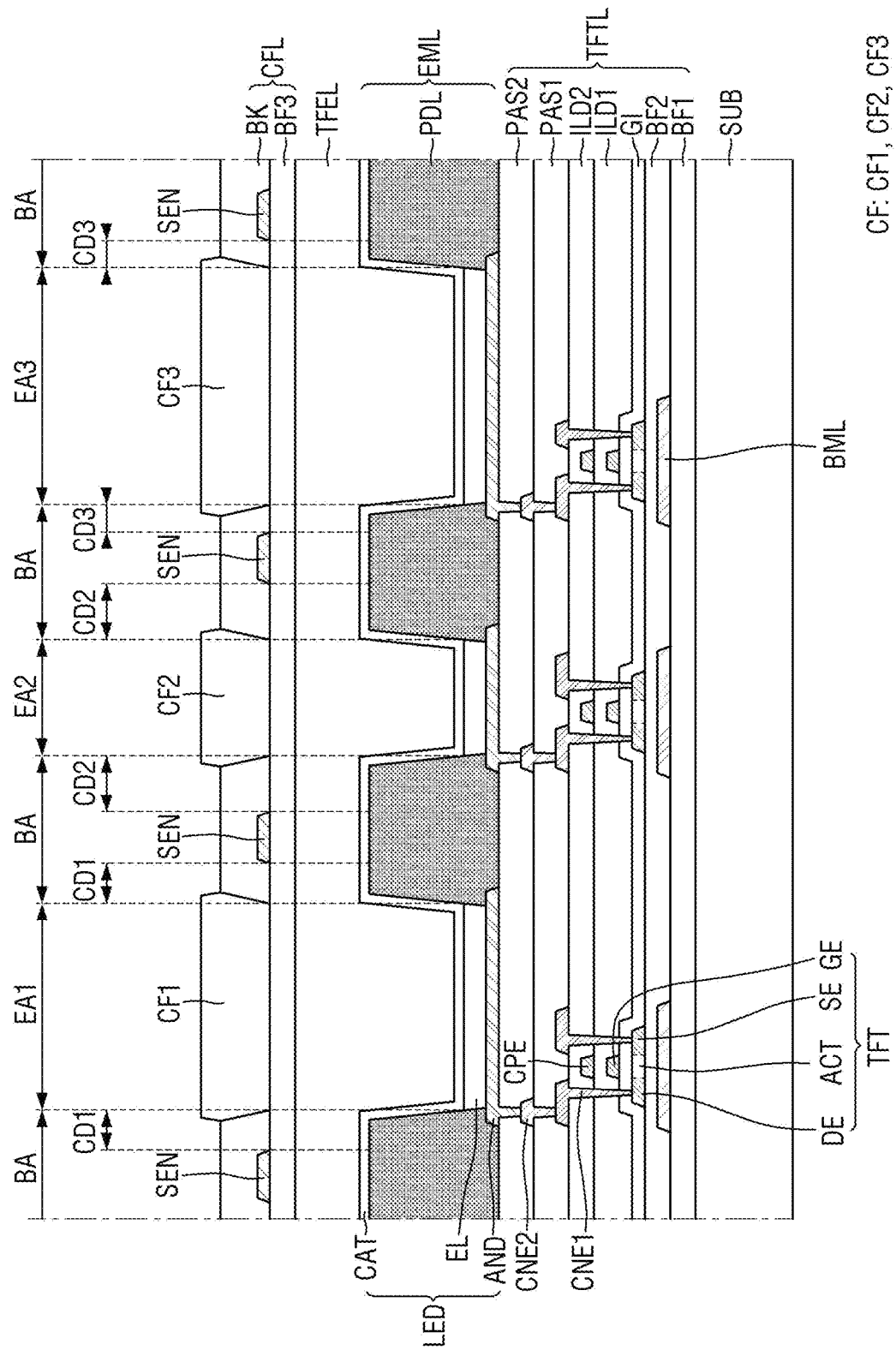
FIG. 10 is a schematic cross-sectional view of a display device according to an embodiment.

FIG. 10 is a schematic cross-sectional view of a display device 10 according to an embodiment. The display device 10 of FIG. 10 may be different from the display device 10 of FIG. 7 at least in configuration above an encapsulation layer TFEL. Therefore, the same configurations as those described above will be briefly described or will not be described.

Referring to FIG. 10, a display panel 100 may include a substrate SUB, a thin-film transistor layer TFTL, a light emitting element layer EML, the encapsulation layer TFEL, and a color filter layer CFL.

The substrate SUB may be a base substrate or a base part. For example, the substrate SUB may include an insulating material such as polymer resin (e.g., polyimide (PI)). As another example, the substrate SUB may include a glass material or a metal material.

The thin-film transistor layer TFTL may be disposed on the substrate SUB. The thin-film transistor layer TFTL may include a first buffer layer BF1, light blocking layers BML, a second buffer layer BF2, thin-film transistors TFT, a gate insulating layer GI, a first interlayer insulating film ILD1, capacitor electrodes CPE, a second interlayer insulating film ILD2, first connection electrodes CNE1, a first passivation layer PAS1, second connection electrodes CNE2, and a second passivation layer PAS2.

The light emitting element layer EML may be disposed on the thin-film transistor layer TFTL. The light emitting element layer EML may include the light emitting elements LED and a pixel defining layer PDL. Each of the light emitting elements LED may include a pixel electrode AND, a light emitting layer EL, and a common electrode CAT.

The pixel defining layer PDL may define first through third emission areas EA1 through EA3. The pixel defining layer PDL may separate and insulate the respective pixel electrodes AND of the light emitting elements LED from each other. The pixel defining layer PDL may absorb light of a specific wavelength. The pixel defining layer PDL may include an infrared absorbing material or an ultraviolet absorbing material. For example, the pixel defining layer PDL may include, but is not limited to, at least one of a diimmonium compound, a polymethine compound, an anthraquinone compound, and a phthalocyanine compound. Therefore, in case that a camera photographs the pixel defining layer PDL using infrared light or ultraviolet light, the pixel defining layer PDL absorbing the infrared light or the ultraviolet light may be distinguished from the pixel electrodes AND and touch electrodes SEN reflecting the infrared light or the ultraviolet light.

For example, the transmittance of the pixel defining layer PDL for light of a specific wavelength may be about 15% or less. Here, the light of the specific wavelength may have a wavelength of, but is not limited to, about 800 nm to about 900 nm. An input device such as an input pen may photograph the pixel defining layer PDL using infrared light having a wavelength of about 800 nm to about 900 nm. In case that the transmittance of the pixel defining layer PDL for the light of the specific wavelength is about 15% or less, the pixel defining layer PDL may be clearly distinguished from the pixel electrodes AND and the touch electrodes SEN reflecting the light of the specific wavelength. In case that the transmittance of the pixel defining layer PDL for the light of the specific wavelength exceeds about 15%, the pixel defining layer PDL may not be clearly distinguished from the pixel electrodes AND and the touch electrodes SEN reflecting the light of the specific wavelength, and the discrimination power of the input device may be reduced. Therefore, the display device 10 may include the pixel defining layer PDL having a transmittance of about 15% or less for light having a wavelength of about 800 nm to about 900 nm. Accordingly, an input device such as an input pen can readily identify a code CD formed of the planar shape of the pixel defining layer PDL, and a sensing system can improve the sensing sensitivity of the input device.

The pixel defining layer PDL may include a plurality of codes CD distinguished from the pixel electrodes AND and the touch electrodes SEN. A part of each pixel electrode AND may be disposed in an emission area EA, and another part of the pixel electrode AND may be covered by the pixel defining layer PDL. Therefore, the pixel electrode AND disposed in the emission area. EA may be exposed to light of a specific wavelength and may reflect the light of the specific wavelength incident to the emission area EA. Each of the codes CD may surround the emission area. EA in plan view and may be surrounded by a touch electrode SEN. Therefore, each of the codes CD may correspond to an area between the emission area EA and the touch electrode SEN.

The codes CD may include first through third codes CD1 through CD3. The first code CD1 may surround a first emission area EA1 and may be surrounded by a touch electrode SEN. The second code CD2 may surround a second emission area EA2 and may be surrounded by the touch electrode SEN. The third code CD3 may surround a third emission area EA3 and may be surrounded by the touch electrode SEN. For example, the area of the third emission area EA3 may be larger than the area of the first emission area EA1, and the area of the first emission area EA1 may be larger than the area of the second emission area EA2. The area of the second code CD2 may be larger than the area of the first code CD1, and the area of the first code CD1 may be larger than the area of the third code CD3. Therefore, the first through third codes CD1 through CD3 may be distinguished by their size and shape.

A code pattern CP may include adjacent codes CD among the first through third codes CD1 through CD3 and a code connection part CDN. The code connection part CDN may connect adjacent codes CD among the first through third codes CD1 through CD3. The code connection part CDN may be exposed to light of a specific wavelength by a cut part CUT of the touch electrode SEN. Therefore, the code pattern CP formed of a combination of adjacent codes CD and the code connection part CDN may have various shapes and sizes.

Since code patterns CP may be disposed over the entire display area DA, and each of the code patterns CP may have position information according to specific criteria. The code patterns CP may be photographed by a camera approaching the front of the display device 10 and may be identified through a photographed video or image. At least one code pattern CP or a combination of code patterns CP may correspond to values of preset data codes. For example, a code pattern CP disposed at a specific position may correspond to a data code designated at that position.

Since the display device 10 may include the pixel defining layer PDL distinguished from the pixel electrodes AND and the touch electrodes SEN and the code patterns CP determined by the planar shape of the pixel defining layer PDL, it may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, it can be applied to many electronic devices having a touch function without being limited by size.

The encapsulation layer TFEL may be disposed on the common electrode CAT to cover the light emitting elements LED.

The color filter layer CFL may be disposed on the encapsulation layer TFEL. The color filter layer CFL may include a third buffer layer BF3, color filters CF, a light blocking part BK, and touch electrodes SEN.

The third buffer layer BF3 may be disposed on the encapsulation layer TFEL. The third buffer layer BF3 may have insulating and optical functions. The third buffer layer BF3 may include at least one inorganic layer. Optionally, the third buffer layer BF3 may be omitted.

The color filters CF may include first through third color filters CF1 through CF3. The first through third color filters CF1 through CF3 may be disposed on the third buffer layer BF3 to correspond to the first through third emission areas EA1 through EA3, respectively.

The first color filter CF1 may be disposed on the third buffer layer BF3 in the first emission area EA1. The first color filter CF1 may be surrounded by the light blocking part BK in plan view. The first color filter CF1 may selectively transmit light of a first color (e.g., red light) and block or absorb light of a second color (e.g., green light) and light of a third color (e.g., blue light). For example, the first color filter CF1 may be a red color filter and may include a red colorant.

The second color filter CF2 may be disposed on the third buffer layer BF3 in the second emission area EA2. The second color filter CF2 may be surrounded by the light blocking part BK in plan view. The second color filter CF2 may selectively transmit light of the second color (e.g., green light) and block or absorb light of the first color (e.g., red light) and light of the third color (e.g., blue light). For example, the second color filter CF2 may be a green color filter and may include a green colorant.

The third color filter CF3 may be disposed on the third buffer layer BF3 in the third emission area EA3. The third color filter CF3 may be surrounded by the light blocking part BK in plan view. The third color filter CF3 may selectively transmit light of the third color (e.g., blue light) and block or absorb light of the first color (e.g., red light) and light of the second color (e.g., green light). For example, the third color filter CF3 may be a blue color filter and may include a blue colorant.

The first through third color filters CF1 through CF3 may absorb a part of light coming from the outside of the display device 10, thereby reducing reflected light due to the external light. Therefore, the first through third color filters CF1 through CF3 may prevent color distortion due to reflection of external light.

Since the color filter layer CFL may be disposed on (e.g., directly disposed on) the encapsulation layer TFEL, the display device 10 may not require a separate substrate for the color filter layer CFL. Therefore, the thickness of the display device 10 can be relatively reduced.

The light blocking part BK may be disposed on the encapsulation layer TFEL in a light blocking area BA. The light blocking part BK may overlap the pixel defining layer PDL in the thickness direction. The light blocking part BK may absorb visible light and transmit infrared light and ultraviolet light. The light blocking part BK may prevent color mixing by preventing intrusion of visible light between the first through third emission areas EA1 through EA3, thereby improving a color gamut of the display device 10. The infrared light or ultraviolet light passing through the light blocking part BK may be absorbed by the pixel defining layer PDL.

For example, the light blocking part BK may include an inorganic black pigment or an organic black pigment. The inorganic black pigment may be carbon black, and the organic black pigment may include at least one of lactam black, perylene black, and aniline black. However, the disclosure is not limited thereto.

The touch electrodes SEN may be disposed on the encapsulation layer TFEL in the light blocking area BA and may be covered by the light blocking part BK. The touch electrodes SEN may be disposed in the color filter layer CFL without requiring a separate touch sensor layer. The touch electrodes SEN may reflect light of a specific wavelength. The touch electrodes SEN may reflect infrared light or ultraviolet light. In case that a camera photographs the pixel defining layer PDL using infrared light or ultraviolet light, the pixel defining layer PDL may be distinguished from the pixel electrodes AND and the touch electrodes SEN.

Since the display device 10 may include the pixel defining layer PDL distinguished from the pixel electrodes AND and the touch electrodes SEN and the code patterns CP determined by the planar shape of the pixel defining layer PDL, it may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, it can be applied to many electronic devices having a touch function without being limited by size.

Figure 11:
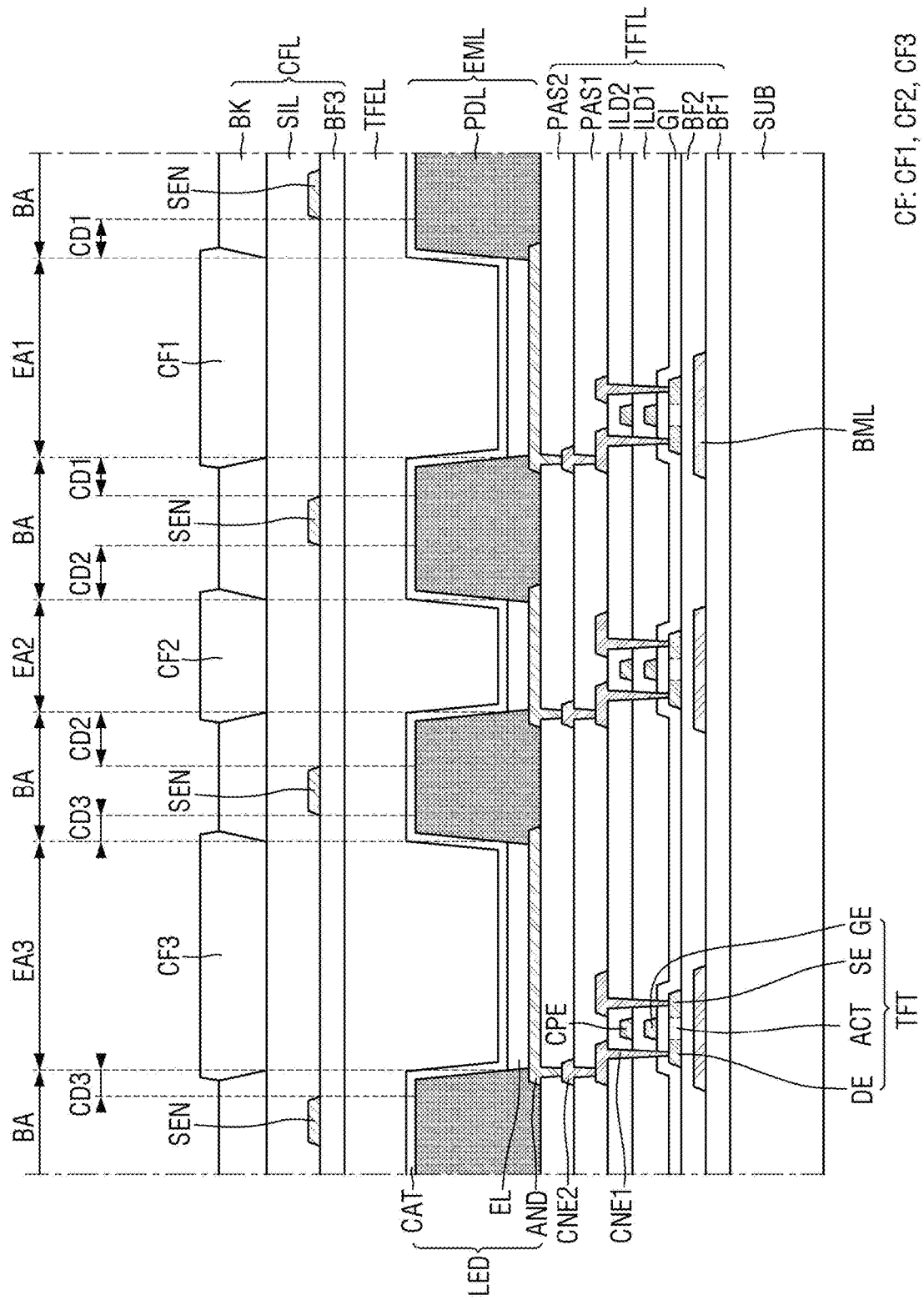
FIG. 11 is a schematic cross-sectional view of a display device according to an embodiment.

FIG. 11 is a schematic cross-sectional view of a display device 10 according to an embodiment. The display device 10 of FIG. 11 may be different from the display device 10 of FIG. 10 at least in the configuration of a plurality of touch electrodes SEN. Therefore, the same configurations as those described above will be briefly described or will not be described.

Referring to FIG. 11, a display panel 100 may include a substrate SUB, a thin-film transistor layer TFTL, a light emitting element layer EML, an encapsulation layer TFEL, and a color filter layer CFL.

The color filter layer CFL may be disposed on the encapsulation layer TFEL. The color filter layer CFL may include a third buffer layer BF3, the touch electrodes SEN, an insulating layer SIL, a plurality of color filters CF, and a light blocking part BK.

The touch electrodes SEN may be disposed on the third buffer layer BF3. The touch electrodes SEN may not overlap first through third emission areas EA1 through EA3. The touch electrodes SEN may reflect light of a specific wavelength. The touch electrodes SEN may reflect infrared light or ultraviolet light. In case that a camera photographs a pixel defining layer PDL using infrared light or ultraviolet light, the pixel defining layer PDL may be distinguished from pixel electrodes AND and the touch electrodes SEN.

The insulating layer SW may be disposed on the touch electrodes SEN and the third buffer layer BF3. The insulating layer SIL may have insulating and optical functions.

The color filters CF may include first through third color filters CF1 through CF3. The first through third color filters CF1 through CF3 may be disposed on the insulating layer SIL to correspond to the first through third emission areas EA1 through EA3, respectively. The first through third color filters CF1 through CF3 may absorb a part of light coming from the outside of the display device 10, thereby reducing reflected light due to the external light. Therefore, the first through third color filters CF1 through CF3 may prevent color distortion due to reflection of external light.

The light blocking part BK may be disposed on the insulating layer SIL in a light blocking area BA. The light blocking part BK may overlap the pixel defining layer PDL in the thickness direction. The light blocking part BK may absorb visible light and transmit infrared light and ultraviolet light. The light blocking part BK may prevent color mixing by preventing intrusion of visible light between the first through third emission areas EA1 through EA3, thereby improving a color gamut of the display device 10. The infrared light or ultraviolet light passing through the light blocking part BK may be absorbed by the pixel defining layer PDL.

A code pattern CP may include adjacent codes CD among first through third codes CD1 through CD3 and a code connection part CDN. Since the display device 10 may include the pixel defining layer PDL distinguished from the pixel electrodes AND and the touch electrodes SEN and a plurality of code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, the display device can be applied to many electronic devices having a touch function without being limited by size.

Figure 12:
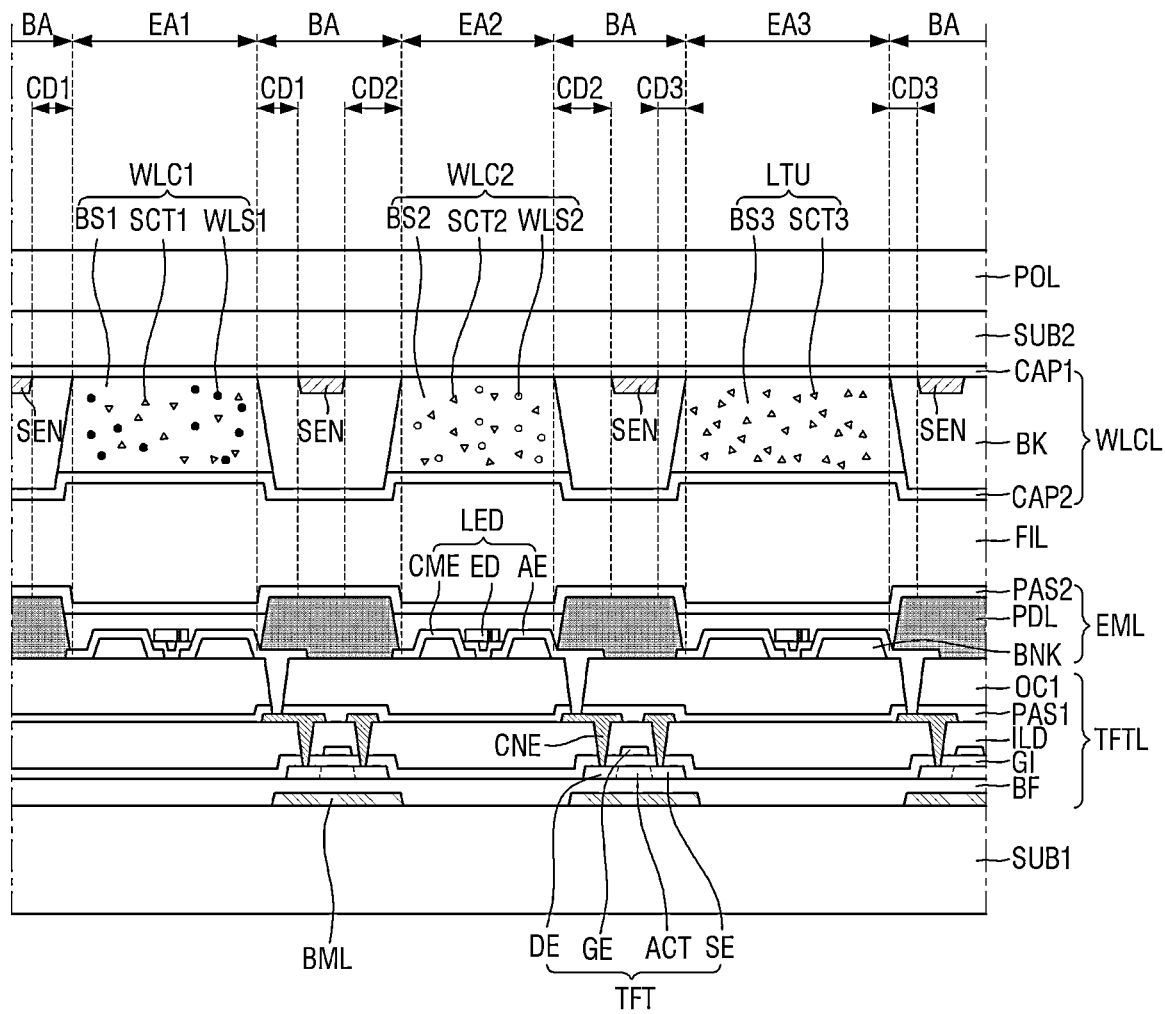
FIG. 12 is a schematic cross-sectional view of a display device according to an embodiment.

FIG. 12 is a schematic cross-sectional view of a display device 10 according to an embodiment. The display device 10 of FIG. 12 may be different from the display device 10 of FIG. 10 at least in the configuration of a light emitting element layer EML and in that the display device may further include a wavelength conversion layer WLCL. Therefore, the same configurations as those described above will be briefly described or will not be described.

Referring to FIG. 12, a display panel 100 may include a first substrate SUB1, a thin-film transistor layer TFTL, the light emitting element layer EML, a filling layer FIL, the wavelength conversion layer WLCL, a second substrate SUB2, and a polarizing film POL.

The first substrate SUB1 may be a base substrate or a base part. For example, the first substrate SUB1 may include an insulating material such as polymer resin (e.g., polyimide (PI)). As another example, the first substrate SUB1 may include a glass material or a metal material.

The thin-film transistor layer TFTL may be disposed on the first substrate SUB1. The thin-film transistor layer TFTL may include a buffer layer BF, light blocking layers BML, thin-film transistors TFT, a gate insulating layer GI, an interlayer insulating film ILD, connection electrodes CNE, a first passivation layer PAS1, and a first planarization layer OC1.

The light emitting element layer EML may be disposed on the thin-film transistor layer TFTL. The light emitting element layer EML may include light emitting elements LED, banks BNK, a pixel defining layer PDL, and a second passivation layer PAS2.

The light emitting elements LED may be disposed on the thin-film transistor layer TFTL. Each of the light emitting elements LED may include a first electrode AE, a second electrode CME, and a light emitting diode ED.

The first electrode AE may be disposed on the first planarization layer OC1. For example, the first electrode AE may cover a bank BNK provided on the first planarization layer OC1. The first electrode AE may overlap at least one of first through third emission areas EA1 through EA3 defined by the pixel defining layer PDL. The first electrode AE may be connected to a drain electrode DE of a thin-film transistor TFT through a connection electrode CNE. The first electrode AE may be, but is not limited to, an anode of each light emitting element LED.

The second electrode CME may be disposed on the first planarization layer OC1 and spaced apart from the first electrode AE. For example, the second electrode CME may cover a bank BNK disposed on the first planarization layer OC1 The second electrode CME may overlap at least one of the first through third emission areas EA1 through EA3 defined by the pixel defining layer PDL. For example, the second electrode CME may receive a low-potential voltage supplied from a low-potential line to all pixels. The second electrode GME may be, but is not limited to, a cathode of each light emitting element LED.

The first and second electrodes AE and CME may reflect light of a specific wavelength. The first and second electrodes AE and CME may reflect infrared light or ultraviolet light. The first and second electrodes AE and CME may include an infrared reflective material or an ultraviolet reflective material. For example, the first and second electrodes AE and CME may include at least one of silver (Ag), copper (Cu), aluminum (Al), nickel (Ni), and lanthanum (La). As another example, the first and second electrodes AE and CME may include a material such as indium tin oxide (ITO), indium zinc oxide (IZO), indium tin zinc oxide (ITZO), or a combination thereof. As another example, each of the first and second electrodes AE and CME may include a transparent conductive material layer and a metal layer having high reflectivity or may include a single layer including a transparent conductive material and a metal having high reflectivity. The first and second electrodes AE and CME may have a stacked structure of ITO/Ag/ITO, ITO/Ag/IZO, or ITO/Ag/ITZO/IZO.

The light emitting diode ED may be disposed on the first planarization layer OC1 between the first electrode AE and the second electrode CME. An end of the light emitting diode ED may be connected to the first electrode AE, and another end of the light emitting diode ED may be connected to the second electrode CME. The light emitting diode ED may be an inorganic light emitting diode having a size of micrometers or nanometers and including an inorganic material. The light emitting diode ED may be aligned between the first electrode AE and the second electrode CME according to an electric field formed in a specific direction between the first electrode AE and the second electrode CME facing each other.

For example, multiple light emitting diodes ED may include active layers having the same material to emit light of the same wavelength band or light of the same color. Light emitted from the first through third emission areas EA1 through EA3 may have the same color. For example, the light emitting diodes ED may emit light of a third color or blue light having a peak wavelength of about 440 nm to about 480 nm. Therefore, the light emitting element layer EML may emit light of the third color or blue light.

The pixel defining layer PDL may be disposed on the first planarization layer OC1 in a light blocking area BA. The pixel defining layer PDL may define the first through third emission areas EA1 through EA3. For example, the pixel defining layer PDL may surround each of the first through third emission areas EA1 through EA3, but the disclosure is not limited thereto. The pixel defining layer PDL may separate and insulate the respective first electrodes AE or second electrodes CME of the light emitting elements LED from each other.

The pixel defining layer PDL may absorb light of a specific wavelength. The pixel defining layer PDL may include an infrared absorbing material or an ultraviolet absorbing material. For example, the pixel defining layer PDL may include, but is not limited to, at least one of a diimmonium compound, a polymethine compound, an anthraquinone compound, and a phthalocyanine compound. Therefore, in case that a camera photographs the pixel defining layer PDL using infrared light or ultraviolet light, the pixel defining layer PDL absorbing the infrared light or the ultraviolet light may be distinguished from the first electrodes AE, the second electrodes CME and touch electrodes SEN reflecting the infrared light or the ultraviolet light.

For example, the transmittance of the pixel defining layer PDL for light of a specific wavelength may be about 15% or less. Here, the light of the specific wavelength may have a wavelength of, but is not limited to, about 800 nm to about 900 nm. An input device such as an input pen may photograph the pixel defining layer PDL using infrared light having a wavelength of about 800 nm, to about 900 nm. In case that the transmittance of the pixel defining layer PDL for the light of the specific wavelength is about 15% or less, the pixel defining layer PDL may be clearly distinguished from the first electrodes AE, the second electrodes CME and the touch electrodes SEN reflecting the light of the specific wavelength. In case that the transmittance of the pixel defining layer PDL for the light of the specific wavelength exceeds about 15%, the pixel defining layer PDL may not be clearly distinguished from the first electrodes AE, the second electrodes CME and the touch electrodes SEN reflecting the light of the specific wavelength, and the discrimination power of the input device may be reduced. Therefore, the display device 10 may include the pixel defining layer PDL having a transmittance of about 15% or less for light having a wavelength of about 800 nm to about 900 nm. Accordingly, an input device such as an input pen can readily identify a code CD formed of the planar shape of the pixel defining layer PDL, and a sensing system can improve the sensing sensitivity of the input device.

The pixel defining layer PDL may include codes CD distinguished from the first electrodes AE, the second electrodes CME, and the touch electrodes SEN. The first and second electrodes AE and CME disposed in an emission area EA may be exposed to light of a specific wavelength and may reflect the light of the specific wavelength incident to the emission area EA. Each of the codes CD may surround the emission area EA in plan view and may be surrounded by, a touch electrode SEN. Therefore, each of the codes CD may correspond to an area between the emission area EA and the touch electrode SEN.

The codes CD may include first through third codes CD1 through CD3. The first code CD1 may surround the first emission area EA1 and may be surrounded by a touch electrode SEN. The second code CD2 may surround the second emission area. EA2 and may be surrounded by the touch electrode SEN. The third code CD3 may surround the third emission area EA3 and may be surrounded by the touch electrode SEN. For example, the area of the third emission area EA3 may be larger than the area of the first emission area EA1, and the area of the first emission area EA1 may be larger than the area of the second emission area EA2. The area of the second code CD2 may be larger than the area of the first code CD1, and the area of the first code CD1 may be larger than the area of the third code CD3. Therefore, the first through third codes CD1 through CD3 may be distinguished by their size and shape.

A code pattern CP may include adjacent codes CD among the first through third codes CD1 through CD3 and a code connection part CDN. The code connection part CDN may connect adjacent codes CD among the first through third codes CD1 through CD3. The code connection part CDN may be exposed to light of a specific wavelength by a cut part CUT of the touch electrode SEN. Therefore, the code pattern CP formed of a combination of adjacent codes CD and the code connection part CDN may have various shapes and sizes.

A plurality of code patterns CP may be disposed over the entire display area DA, and each of the code patterns CP may have position information according to specific criteria. The code patterns CP may be photographed by a camera approaching the front of the display device 10 and may be identified through a photographed video or image. At least one code pattern CP or a combination of code patterns CP may correspond to values of preset data codes. For example, a code pattern CP disposed at a specific position may correspond to a data code designated at that position.

Since the display device 10 may include the pixel defining layer PDL distinguished from the first electrodes AE, the second electrodes CME and the touch electrodes SEN and the code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, the display device can be applied to many electronic devices having a touch function without being limited by size.

The second passivation layer PAS2 may be disposed on the light emitting elements LED and the pixel defining layer PDL. The second passivation layer PAS2 may cover the light emitting elements LED and protect the light emitting elements LED. The second passivation layer PAS2 may prevent damage to the light emitting elements LED by preventing penetration of impurities such as moisture or air from the outside.

The filling layer FIL may fill a space between the light emitting element layer EML and the wavelength conversion layer WLCL and may be surrounded by a sealing member. For example, the filling layer FIL may be made of an organic material and may transmit light. The filling layer FIL may be made of a silicon-based organic material or an epoxy-based organic material, but the disclosure is not necessarily limited thereto. As another example, the filling layer FIL may be omitted.

The wavelength conversion layer WLCL may include a second capping layer CAP2, a light blocking part BK, a plurality of touch electrodes SEN, a first wavelength conversion part WLC1, a second wavelength conversion part WLC2, a light transmission part LTU, and a first capping layer CAP1.

The second capping layer CAP2 may be disposed on the filling layer FIL. The second capping layer CAP2 may seal lower surfaces of the first and second wavelength conversion parts WLC1 and WLC2, the light transmission part LTU, and the light blocking part BK. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. For example, the second capping layer CAP2 may include an inorganic material.

The first wavelength conversion part WLC1 may be disposed on the second capping layer CAP2 in the first emission area EA1. The first wavelength conversion part WLC1 may be surrounded by the light blocking part BK. The first wavelength conversion part WLC1 may include a first base resin BS1, first scatterers SCT1, and first wavelength shifters WLS1.

The first base resin BS1 may include a material having a relatively high light transmittance. The first base resin BS1 may be made of a transparent organic material.

The first scatterers SCT1 may have a refractive index different from that of the first base resin BSI and may form an optical interface with the first base resin BS1. For example, the first scatterers SCT1 may include a light scattering material or light scattering particles that scatter at least a part of transmitted light. The first scatterers SCT1 may scatter incident light in random directions regardless of the incident direction of the incident light without substantially converting the peak wavelength of the incident light.

The first wavelength shifters WLS1 may convert or shift the peak wavelength of incident light into a first peak wavelength. For example, the first wavelength shifters WLS1 may convert blue light provided by the display device 10 into red light having a single peak wavelength of about 610 nm to about 650 nm and emit the red light.

The second wavelength conversion part WLC2 may be disposed on the second capping layer CAP2 in the second emission area EA2. The second wavelength conversion part WLC2 may be surrounded by the light blocking part BK. The second wavelength conversion part WLC2 may include a second base resin BS2, second scatterers SCT2, and second wavelength shifters WLS2.

The second base resin BS2 may include a material having a relatively high light transmittance. The second base resin BS2 may be made of a transparent organic material.

The second scatterers SCT2 may have a refractive index different from that of the second base resin BS2 and may form an optical interface with the second base resin BS2. For example, the second scatterers SCT2 may include a light scattering material or light scattering particles that scatter at least a part of transmitted light. The second scatterers SCT2 may scatter incident light in random directions regardless of the incident direction of the incident light without substantially converting the peak wavelength of the incident light.

The second wavelength shifters WLS2 may convert or shift the peak wavelength of incident light into a second peak wavelength different from the first peak wavelength of the first wavelength shifters WLS1. For example, the second wavelength shifters WLS2 may convert blue light provided by the display device 10 into green light having a single peak wavelength of about 510 nm to about 550 nm and emit the green light.

The light transmission part LTU may be disposed on the second capping layer CAP2 in the third emission area EA3. The light transmission part LTU may be surrounded by the light blocking part BK. The light transmission part LTU may transmit incident light while maintaining the peal wavelength of the incident light. The light transmission part LTU may include a third base resin BS3 and third scatterers SCT3.

The third base resin BS3 may include a material having a relatively high light transmittance. The third base resin BS3 may be made of a transparent organic material.

The third scatterers SCT3 may have a refractive index different from that of the third base resin BS3 and may form an optical interface with the third base resin BS3, For example, the third scatterers SCT3 may include a light scattering material or light scattering particles that scatter at least a part of transmitted light. The third scatterer SCT3 may scatter incident light in random directions regardless of the incident direction of the incident light without substantially converting the peak wavelength of the incident light.

The light blocking part BK may be disposed on the second capping layer CAP2 in the light blocking area BA. The light blocking part BK may cover lower surfaces of the touch electrodes SEN. The light blocking part BK may overlap the pixel defining layer PDL in the thickness direction. The light blocking part BK may surround the first and second wavelength conversion parts WLC1 and WLC2 and the light transmission part LTU in plan view. The light blocking part BK may absorb visible light and transmit infrared light and ultraviolet light. The light blocking part BK may be disposed in a lattice shape surrounding the first through third emission areas EA1 through EA3 in plan view. The light blocking part BK may prevent color mixing by preventing intrusion of light between the first through third emission areas EA1 through EA3, thereby improving a color gamut of the display device 10. The infrared light or ultraviolet light passing through the light blocking part BK may be absorbed by the pixel defining layer PDL.

The touch electrodes SEN may be disposed on a surface of the first capping layer CAP1 which faces the first substrate SUB1. Upper surfaces of the touch electrodes SEN may be disposed on the surface of the first capping layer CAP1, and the lower surfaces of the touch electrodes SEN may be covered by the light blocking part BK. Therefore, the touch electrodes SEN may be disposed in the wavelength conversion layer WLCL without requiring a separate touch sensor layer. The touch electrodes SEN may reflect light of a specific wavelength. The touch electrodes SEN may reflect infrared light or ultraviolet light. In case that a camera photographs the pixel defining layer PDL using infrared light or ultraviolet light, the pixel defining layer PDL may be distinguished from the first electrodes AE, the second electrodes CME, and the touch electrodes SEN.

The first capping layer CAP1 may be disposed on the first and second wavelength conversion parts WLC1 and WLC2, the light transmission part LTU, the light blocking part BK, and the touch electrodes SEN. The first capping layer CAP1 may be disposed on a surface of the second substrate SUB2 which faces the first substrate SUB1. The first capping layer CAP1 may prevent damage to or contamination of the first and second wavelength conversion parts WLC1 and WLC2 and the light transmission part LTU by sealing upper surfaces of the first and second wavelength conversion parts WLC1 and WLC2 and the light transmission part LTU. For example, the first capping layer CAP1 may include an inorganic material.

The second substrate SUB2 may be disposed on the wavelength conversion layer WLCL. The second substrate SUB2 may support and protect the display device 10. The second substrate SUB2 may be a base substrate or a base part. For example, the second substrate SUB2 may include an insulating material such as polymer resin (e.g., polyimide (PI)). As another example, the second substrate SUB2 may include a glass material or a metal material.

The polarizing film POL may be disposed on the second substrate SUB2. For example, the polarizing film POL may include a linear polarizer and a retardation film such as a $\lambda/4$ plate. The retardation film and the linear polarizer may be sequentially stacked on the second substrate SUB2.

Figure 13:
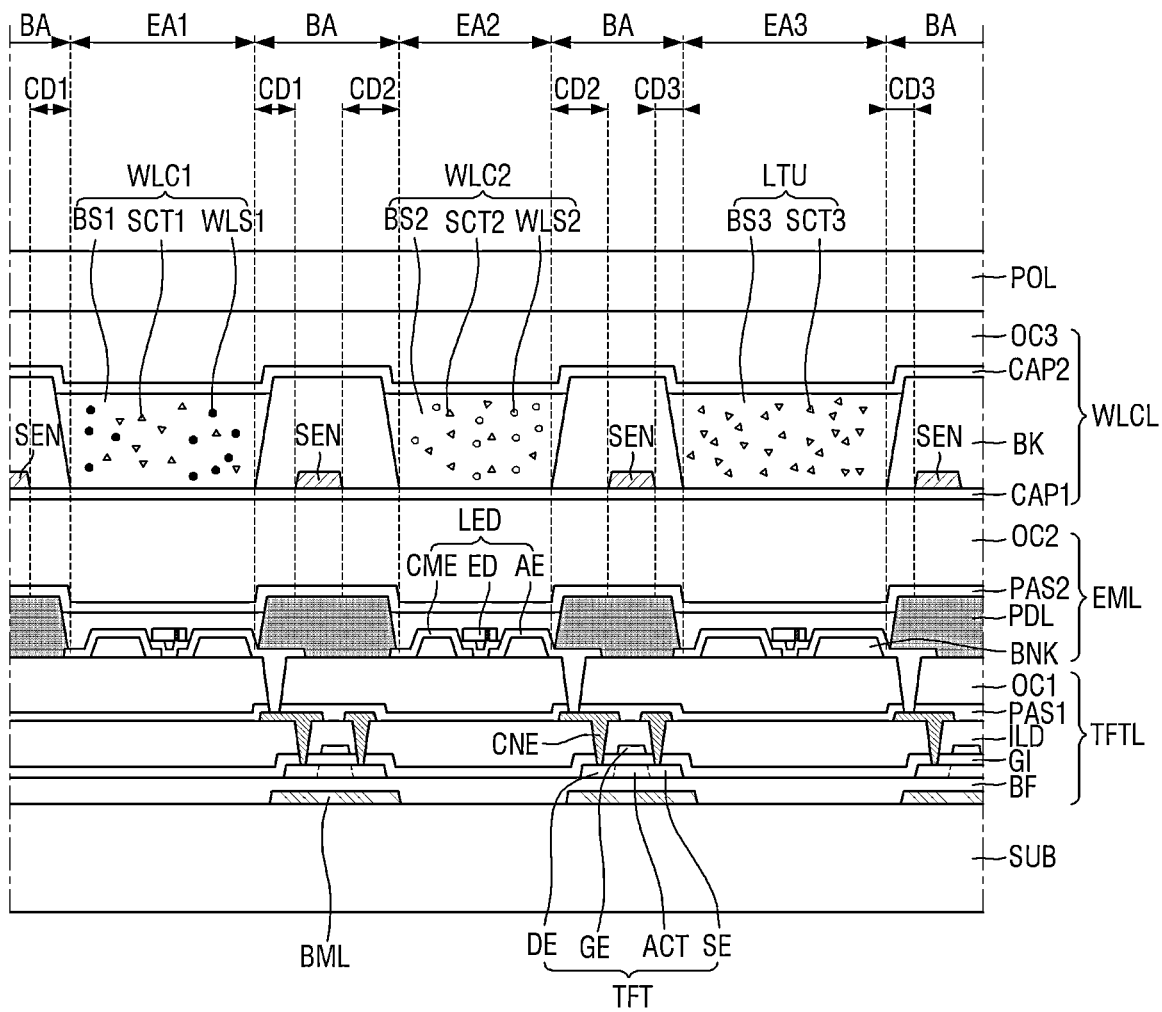
FIG. 13 is a schematic cross-sectional view of a display device according to an embodiment.

FIG. 13 is a schematic cross-sectional view of a display device 10 according to an embodiment. The display device 10 of FIG. 13 may be different from the display device 10 of FIG. 12 at least in that the display device may not include a second substrate SUB2 and in the configuration of a wavelength conversion layer WLCL. Therefore, the same configurations as those described above will be briefly described or will not be described.

Referring to FIG. 13, a display panel 100 may include a substrate SUB, a thin-film transistor layer TFTL, a light emitting element layer EML, the wavelength conversion layer WLCL, and a polarizing film POL.

The substrate SUB may be a base substrate or a base part. For example, the substrate SUB may include an insulating material such as polymer resin (e.g., polyimide (PI)). As another example, the substrate SUB may include a glass material or a metal material.

The thin-film transistor layer TFTL may be disposed on the substrate SUB. The thin-film transistor layer TFTL may include a buffer layer BF, light blocking layers BML, thin-film transistors TFT, a gate insulating layer GI, an interlayer insulating film ILD, connection electrodes CNE, a first passivation layer PAS1, and a first planarization layer OC1.

The light emitting element layer EML, may be disposed on the thin-film transistor layer TFTL The light emitting element layer EML may include light emitting elements LED, banks BNK, a pixel defining layer PDL, a second passivation layer PAS2, and a second planarization layer OC2. The second planarization layer OC2 may be disposed on the second passivation layer PAS2 to planarize the top of the light emitting element layer EML. For example, the second planarization layer OC2 may include an organic material.

The wavelength conversion layer WLCL may include a first capping layer CAP1, a light blocking part BK, a plurality of touch electrodes SEN, a first wavelength conversion part WLC1, a second wavelength conversion part WLC2, a light transmission part LTU, a second capping layer CAP2, and third planarization layer OC3.

The first capping layer CAP1 may be disposed on the second planarization layer OC2 of the light emitting element layer EML. The first capping layer CAP1 may seal lower surfaces of the first and second wavelength conversion parts WLC1 and WLC2 and the light transmission part LTU. For example, the first capping layer CAP1 may include an inorganic material.

The light blocking part BK may be disposed on the first capping layer CAP1 in a light blocking area BA. The light blocking part BK may overlap the pixel defining layer PDL in the thickness direction. The light blocking part BK may surround the first and second wavelength conversion parts WLC1 and WLC2 and the light transmission part LTU in plan view. The light blocking part BK may block visible light and transmit infrared light or ultraviolet light. The light blocking part BK may be disposed in a lattice shape surrounding first through third emission areas EA1 through EA3 in plan view. The light blocking part BK may prevent color mixing by preventing intrusion of visible light between the first through third emission areas EA1 through EA3, thereby improving a color gamut of the display device 10. The infrared light or ultraviolet light passing through the light blocking part BK may be absorbed by the pixel defining layer PDL.

The touch electrodes SEN may be disposed on the first capping layer CAP1 in the light blocking area BA. The touch electrodes SEN may be disposed in the wavelength conversion layer WLCL without requiring a separate touch sensor layer. The touch electrodes SEN may reflect light of a specific wavelength. The touch electrodes SEN may include an infrared reflective material or an ultraviolet reflective material. Therefore, the touch electrodes SEN may reflect infrared light or ultraviolet light passing through the light blocking part BK.

The first wavelength conversion part WLC1 may be disposed on the first capping layer CAP1 in the first emission area EA1. The first wavelength conversion part WLC1 may be surrounded by the light blocking part BK. The first wavelength conversion part WLC1 may include a first base resin BS1, first scatterers SCT1, and first wavelength shifters WLS1.

The second wavelength conversion part WLC2 may be disposed on the first capping layer CAP1 in the second emission area EA2. The second wavelength conversion part WLC2 may be surrounded by the light blocking part BK. The second wavelength conversion part WLC2 may include a second base resin BS2, second scatterers SCT2, and second wavelength shifters WLS2.

The light transmission part LTU may be disposed on the first capping layer CAP1 in the third emission area EA3. The light transmission part LTU may be surrounded by the light blocking part BK. The light transmission part LTU may transmit incident light while maintaining the peak wavelength of the incident light. The light transmission part LTU may include a third base resin BS3 and third scatterers SCT3.

The second capping layer CAP2 may cover the first and second wavelength conversion parts WLC1 and WLC2, the light transmission part LTU, and the light blocking part BK. For example, the second capping layer CAP2 may prevent damage to or contamination of the first and second wavelength conversion parts WLC1 and WLC2 and the light transmission part LTU by sealing the first and second wavelength conversion parts WLC1 and WLC2 and the light transmission part LTU. For example, the second capping layer CAP2 may include an inorganic material.

A third planarization layer OC3 may be disposed on the second capping layer CAP2 to planarize the tops of the first and second wavelength conversion parts WLC1 and WLC2 and the light transmission part LTU. For example, the third planarization layer OC3 may include an organic material.

The polarizing film POL may be disposed on the third planarization layer OC3. For example, the polarizing film POL may include a linear polarizer and a retardation film such as a $\lambda/4$ plate. The retardation film and the linear polarizer may be sequentially stacked on the third planarization layer OC3.

A code pattern CP may include adjacent codes CD among first through third codes CD1 through CD3 and a code connection part CDN. Since the display device 10 may include the pixel defining layer PDL distinguished from first electrodes AE, second electrodes CME and the touch electrodes SEN and a plurality of code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, the display device can be applied to many electronic devices having a touch function without being limited by size.

Figure 14:
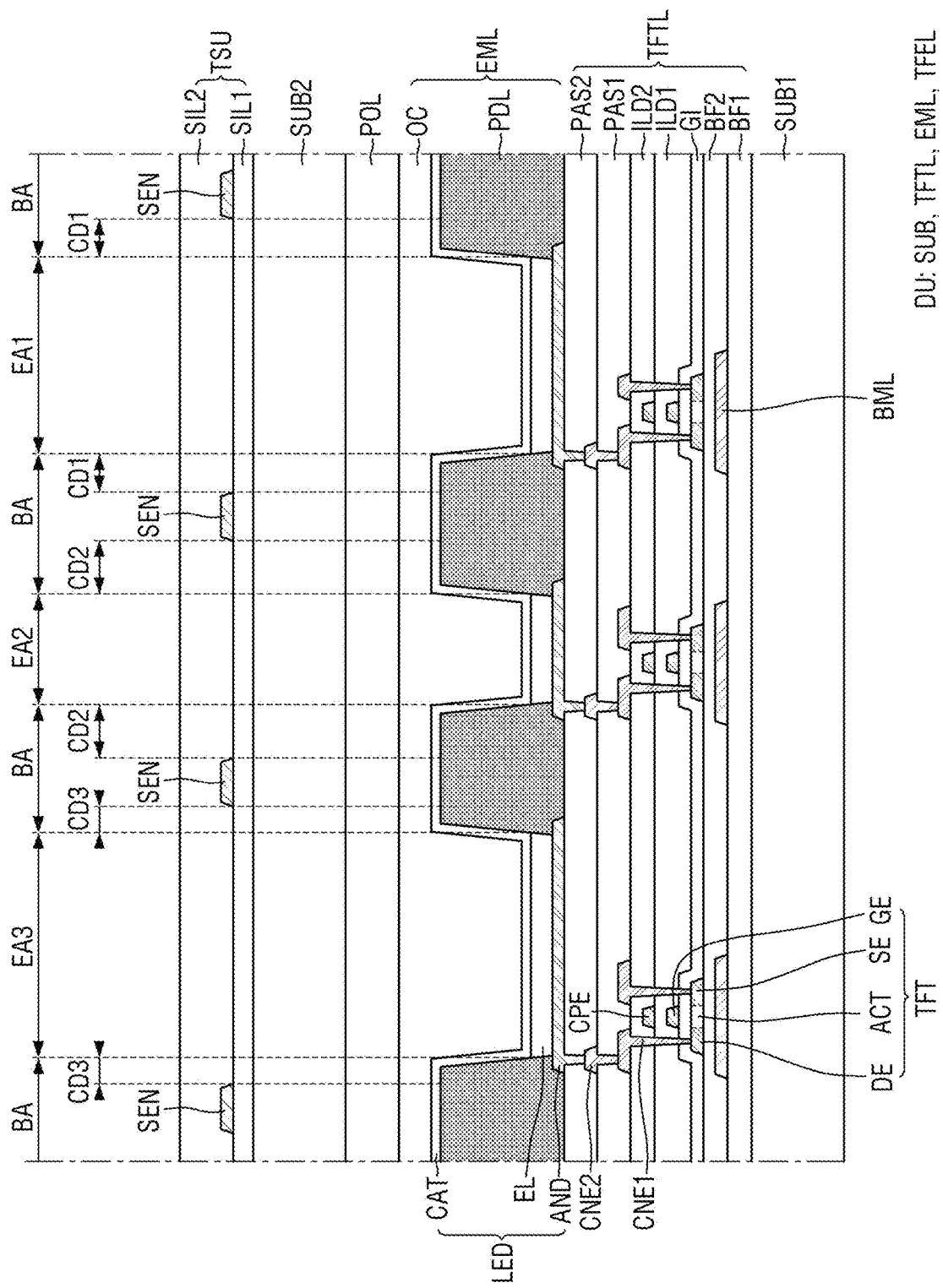
FIG. 14 is a schematic cross-sectional view of a display device according to an embodiment.

FIG. 14 is a schematic cross-sectional view of a display device 10 according to an embodiment. The display device 10 of FIG. 14 may be different from the display device 10 of FIG. 7 at least in configuration above a light emitting element layer EML. Therefore, the same configurations as those described above will be briefly described or will not be described.

Referring to FIG. 14, a display panel 100 may include a first substrate SUB1, a thin-film transistor layer TFTL, the light emitting element layer EML, a polarizing film POL, a second substrate SUB2, and a touch sensing unit TSU.

The first substrate SUB1 may be a base substrate or a base part. For example, the first substrate SUB1 may include an insulating material such as polymer resin (e.g., polyimide (PI)). As another example, the first substrate SUB1 may include a glass material or a metal material.

The thin-film transistor layer TFTL may be disposed on the first substrate SUB1. The thin-film transistor layer TFTL may include a first buffer layer BF1, light blocking layers BML, a second buffer layer BF2, thin-film transistors TFT, a gate insulating layer GI, a first interlayer insulating film ILD1, capacitor electrodes CPE, a second interlayer insulating film ILD2, first connection electrodes CNE1, a first passivation layer PAS1, second connection electrodes CNE2, and a second passivation layer PAS2.

The light emitting element layer EMIL may be disposed on the thin-film transistor layer TFTL. The light emitting element layer EML may include light emitting elements LED, a pixel defining layer PDL, and a planarization layer OC. Each of the light emitting elements LED may include a pixel electrode AND, a light emitting layer EL, and a common electrode CAT. The pixel defining layer PDL may define first through third emission areas EA1 through EA3. The planarization layer OC may be disposed on the common electrode CAT to planarize the top of the light emitting element layer EML.

The polarizing film POL may be disposed on the light emitting element layer EML. For example, the polarizing film POL may include a linear polarizer and a retardation film such as a $\lambda/4$ plate.

The second substrate SUB2 may be disposed on the polarizing, film POL. The second substrate SUB2 may be a base substrate or a base part. For example, the second substrate SUB2 may include an insulating material such as polymer resin (e.g., polyimide (PI)). As another example, the second substrate SUB2 may include a glass material or a metal material.

The touch sensing unit TSU may be disposed on the second substrate SUB2. The touch sensing unit TSU may include a first insulating layer SIL1, a plurality of touch electrodes SEN, and a second insulating layer SIL2.

The first insulating layer SIL1 may be disposed on the second substrate SUB2. The first insulating layer SIL1 may have insulating and optical functions.

The touch electrodes SEN may be disposed on the first insulating layer SIL1. The touch electrodes SEN may not overlap the first through third emission areas EA1 through EA3. The touch electrodes SEN may be formed in a mesh structure or a net structure in plan view. The touch electrodes SEN may reflect light of a specific wavelength. The touch electrodes SEN may reflect infrared light or ultraviolet light.

The second insulating layer SIL2 may be disposed on the touch electrodes SEN and the first insulating layer SIL1 The second insulating layer SIL2 may have insulating and optical functions.

A code pattern CP may include adjacent codes CD among first through third codes CD1 through CD3 and a code connection part CDN. Since the display device 10 may include the pixel defining layer PDL distinguished from the pixel electrodes AND and the touch electrodes SEN and code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, the display device can be applied to many electronic devices having a touch function without being limited by size.

Figure 15:
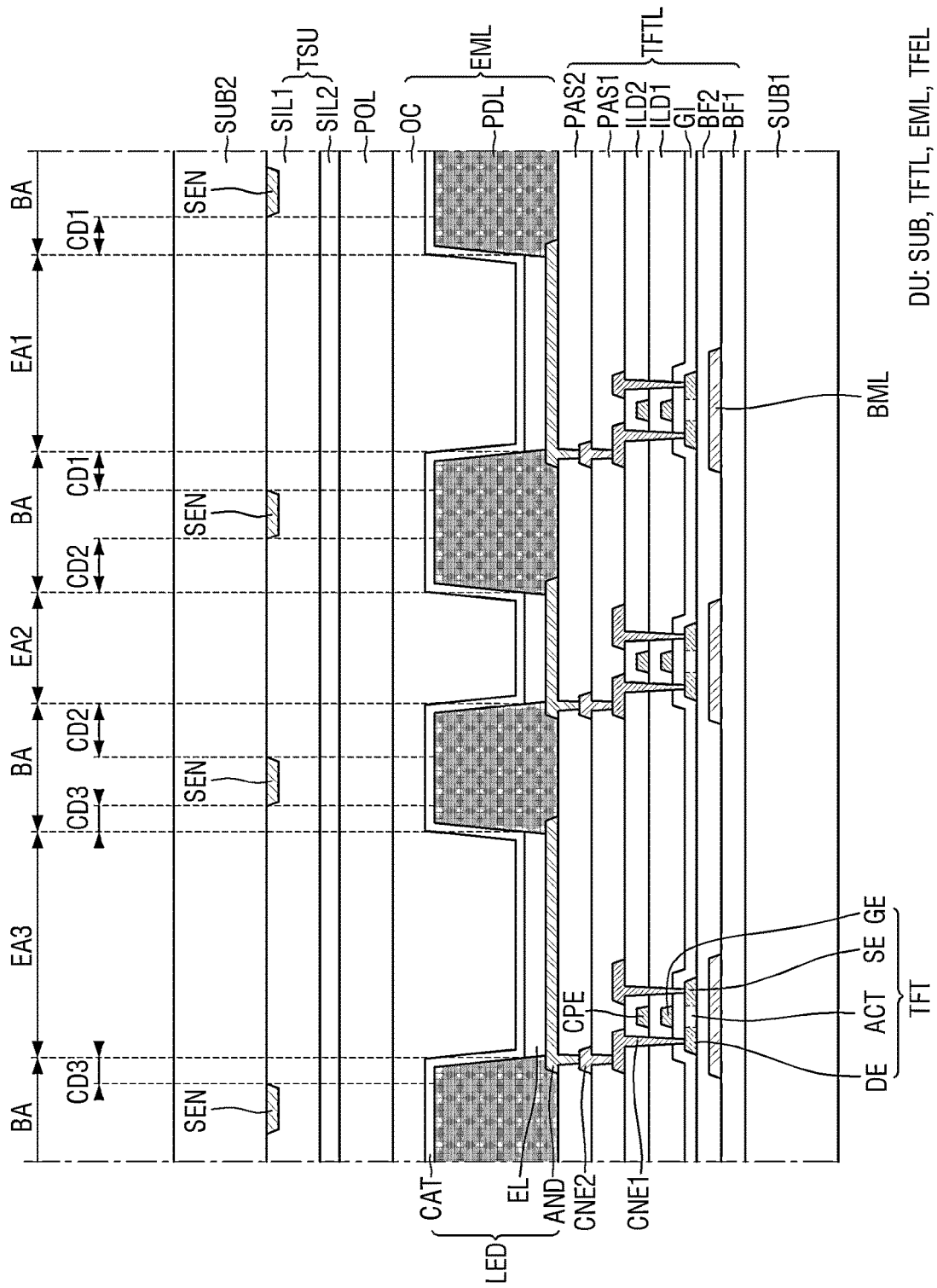
FIG. 15 is a schematic cross-sectional view of a display device according to an embodiment.

FIG. 15 is a schematic cross-sectional view of a display device 10 according to an embodiment. The display device 10 of FIG. 15 may be different from the display device 10 of FIG. 14 at least in configuration above a polarizing film POL. Therefore, the same configurations as those described above will be briefly described or will not be described.

Referring to FIG. 15, a display panel 100 may include a first substrate SUB1, a thin-film transistor layer TFTL, a light emitting element layer EML, the polarizing film POL, a touch sensing unit TSU, and a second substrate SUB2.

The second substrate SUB2 may face the first substrate SUB1. The second substrate SUB2 may be bonded to the first substrate SUB1 after a plurality of touch electrodes SEN, a first insulating layer SILL and a second insulating layer SIL2 may be provided. The second substrate SUB2 may be a base substrate or a base part. For example, the second substrate SUB2 may include an insulating material such as polymer resin (e.g., polyimide (PI)). As another example, the second substrate SUB2 may include a glass material or a metal material.

The touch sensing unit TSU may include the touch electrodes SEN, the first insulating layer SIL1 and the second insulating layer SIL2.

The touch electrodes SEN may be disposed under the second substrate SUB2. The touch electrodes SEN may be disposed on a surface of the second substrate SUB2 which faces the first substrate SUB1. The touch electrodes SEN may reflect light of a specific wavelength. The touch electrodes SEN may reflect infrared light or ultraviolet light. The touch electrodes SEN may not overlap first through third emission areas EA1 through EA3.

The first insulating layer SIL1 may cover the touch electrodes SEN and the second substrate SUB2. The second insulating layer SIL1 may be disposed between the polarizing film POL and the first insulating layer SIL1. The first and second insulating layers SIL1 and SIL2 may have insulating and optical functions.

A code pattern CP may include adjacent codes CD among first through third codes CD1 through CD3 and a code connection part CDN. Since the display device 10 may include the pixel defining layer PDL distinguished from pixel electrodes AND and the touch electrodes SEN and code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining the first through third emission areas EA1 through EA3, the display device can be applied to many electronic devices having a touch function without being limited by size.

Figure 16:
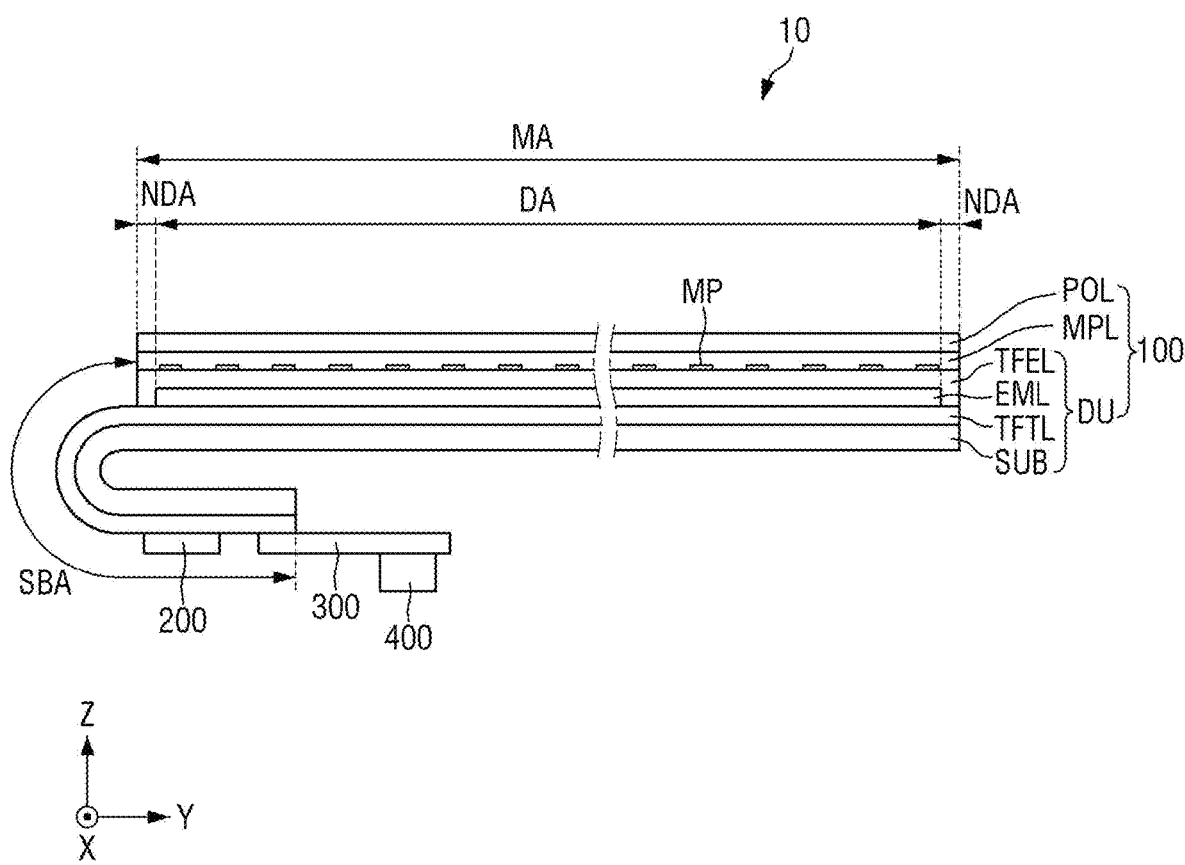
FIG. 16 is a schematic cross-sectional view of a display device according to an embodiment.
Figure 17:
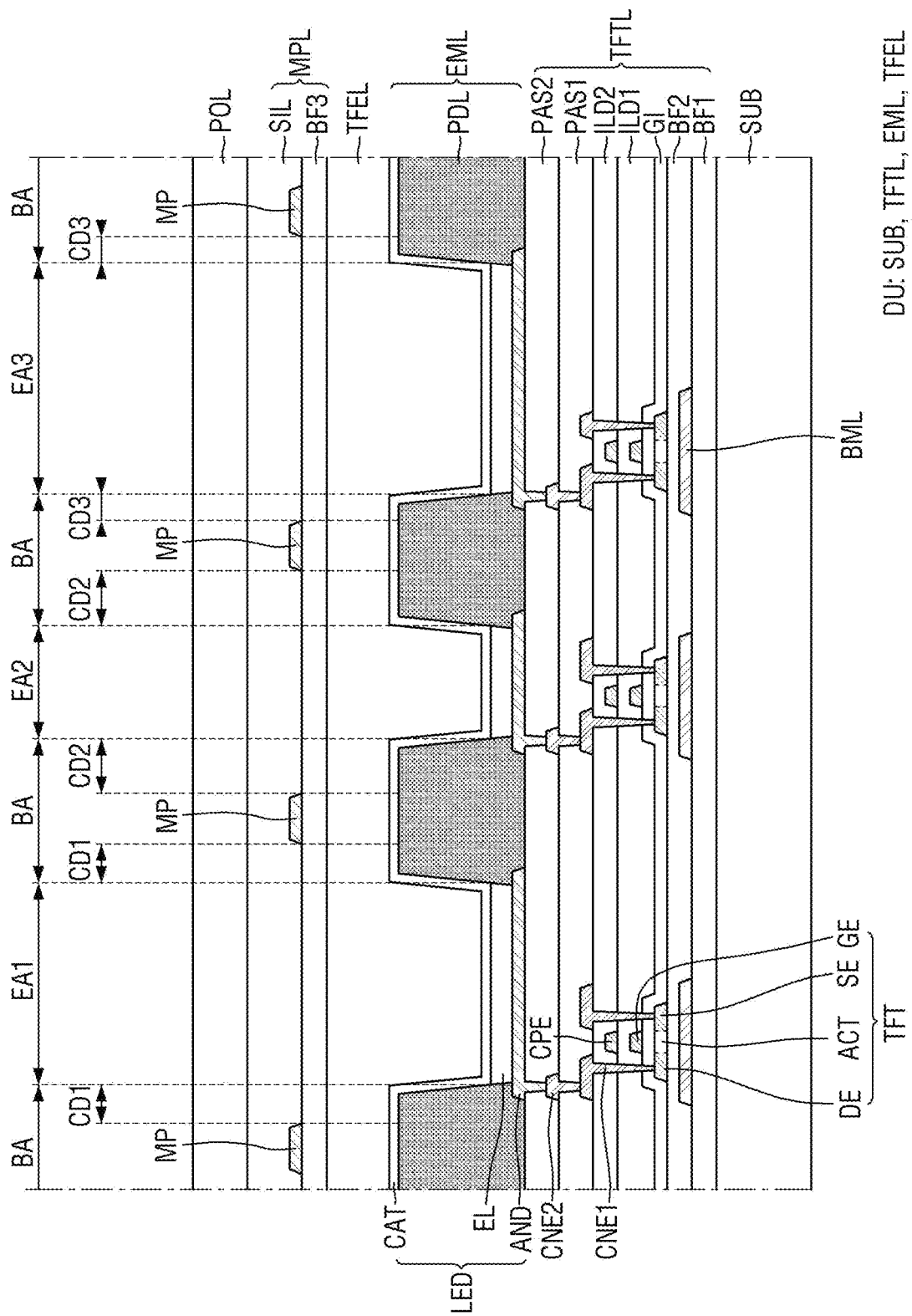
FIG. 17 is a schematic cross-sectional view of the display device of FIG. 16.

FIG. 16 is a schematic cross-sectional view of a display device 10 according to an embodiment. FIG. 17 is a schematic cross-sectional view of the display device 10 of FIG. 16. The display device 10 of FIGS. 16 and 17 may be different from the display device 10 of FIG. 2 at least in a metal pattern layer MPL. Therefore, the same configurations as those described above will be briefly described or will not be described.

Referring to FIGS. 16 and 17, a display panel 100 may include a display unit DU, the metal pattern layer MPL, and a polarizing film POL. The display unit DU may include a substrate SUB, a thin-film transistor layer TFTL, a light emitting element layer EML, and an encapsulation layer TFEL.

The metal pattern layer MPL may include a third buffer layer BF3, a metal pattern MP, and an insulating layer SIL.

The third buffer layer BF3 may be disposed on the encapsulation layer TFEL. The third buffer layer BF3 may have insulating and optical functions. The third buffer layer BF3 may include at least one inorganic layer. Optionally, the third buffer layer BF3 may be omitted.

The metal pattern MP may be disposed on the third buffer layer BF3. The metal pattern MP may have a single layer-mesh structure or net structure in plan view. Minimum unit sides of the metal pattern MP may extend in different directions to intersect each other. The mesh structure of the metal pattern MP may have an intersection angle. The intersection angle of the metal pattern MP may be designed to reduce or prevent a moire phenomenon. Since the display device 10 may include the metal pattern NIP having a relatively reduced line width and a relatively increased pitch, visibility can be improved. The metal pattern MP may be electrically independent. For example, the metal pattern MP may be floating by being electrically independent or may be grounded by being connected to a ground line.

The metal pattern MP may reflect light of a specific wavelength. The metal pattern MP may reflect infrared light or ultraviolet light. The metal pattern MP may include an infrared reflective material or an ultraviolet reflective material. The metal pattern MP may be formed of a single layer of molybdenum (Mo), titanium (Ti), copper (Cu), aluminum (Al) or indium tin oxide (ITO) or may be formed of a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The metal pattern NIP may be formed on the third buffer layer BF3 through a metal transfer process, but the disclosure is not limited thereto.

A code pattern CP may include adjacent codes CD among first through third codes CD1 through CD3 and a code connection part CDN. Since the display device 10 may include a pixel defining layer PDL distinguished from pixel electrodes AND and the metal pattern MP and code patterns CP determined by the planar shape of the pixel defining layer PDL, the display device may receive an input from an input device such as an input pen. At least one code pattern CP or a combination of code patterns CP may have position information according to specific criteria and may correspond one-to-one to preset data codes. Therefore, the display device 10 may receive coordinate data generated using the data codes without complicated calculation and correction. Accordingly, the display device 10 can perform a corresponding function based on accurate input coordinates, reduce cost and power consumption, and simplify a driving process. Since the display device 10 may include the code patterns CP formed of the pixel defining layer PDL defining first through third emission areas EA1 through EA3, the display device can be applied to many electronic devices without being limited by size.

The insulating layer SIL may be disposed on the metal pattern MP and the third buffer layer BF3. The insulating layer SIL may have insulating and optical functions. The polarizing film PCL may be disposed on the insulating layer SIL.

Figure 18:
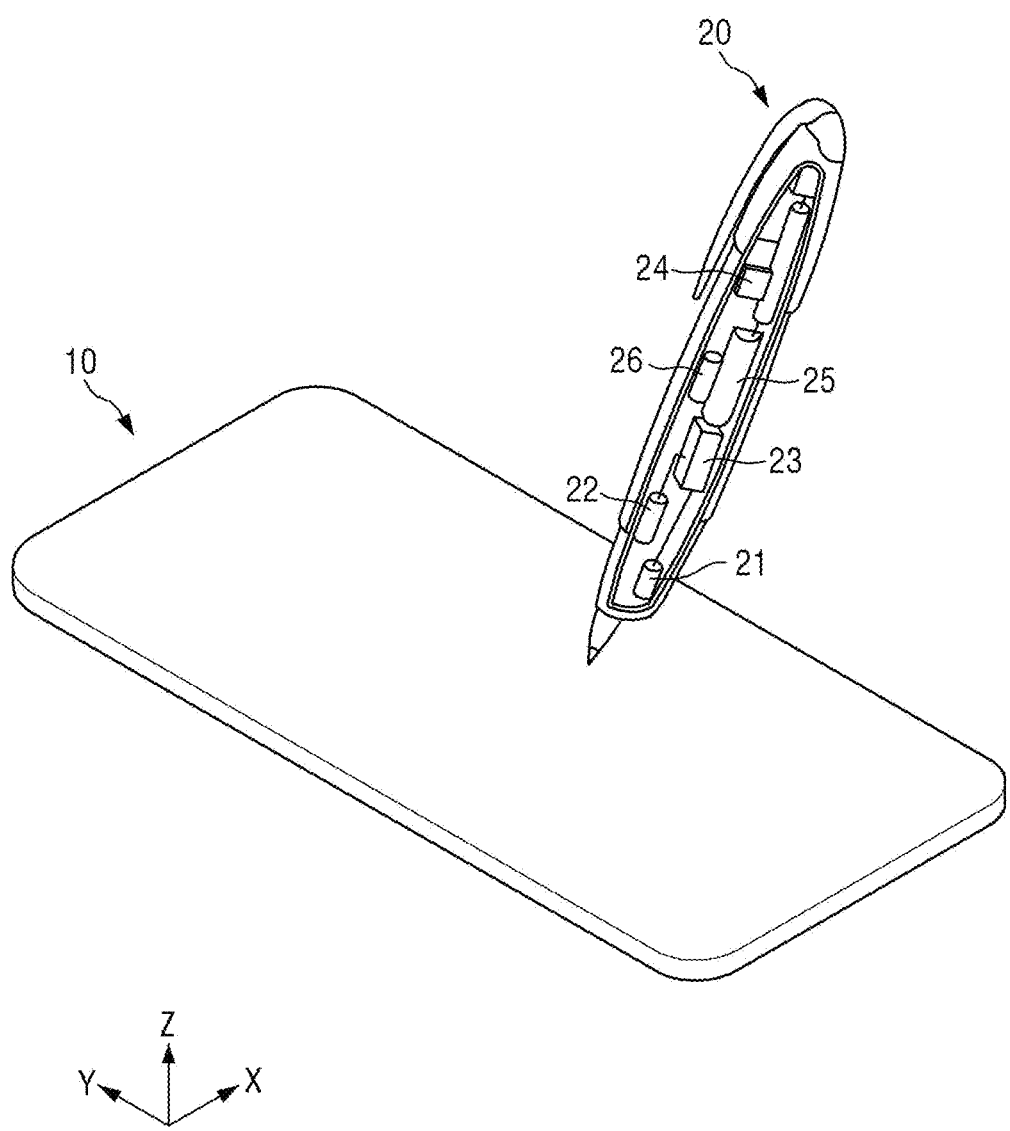
FIG. 18 is a schematic perspective view of a sensing system according to an embodiment.
Figure 19:
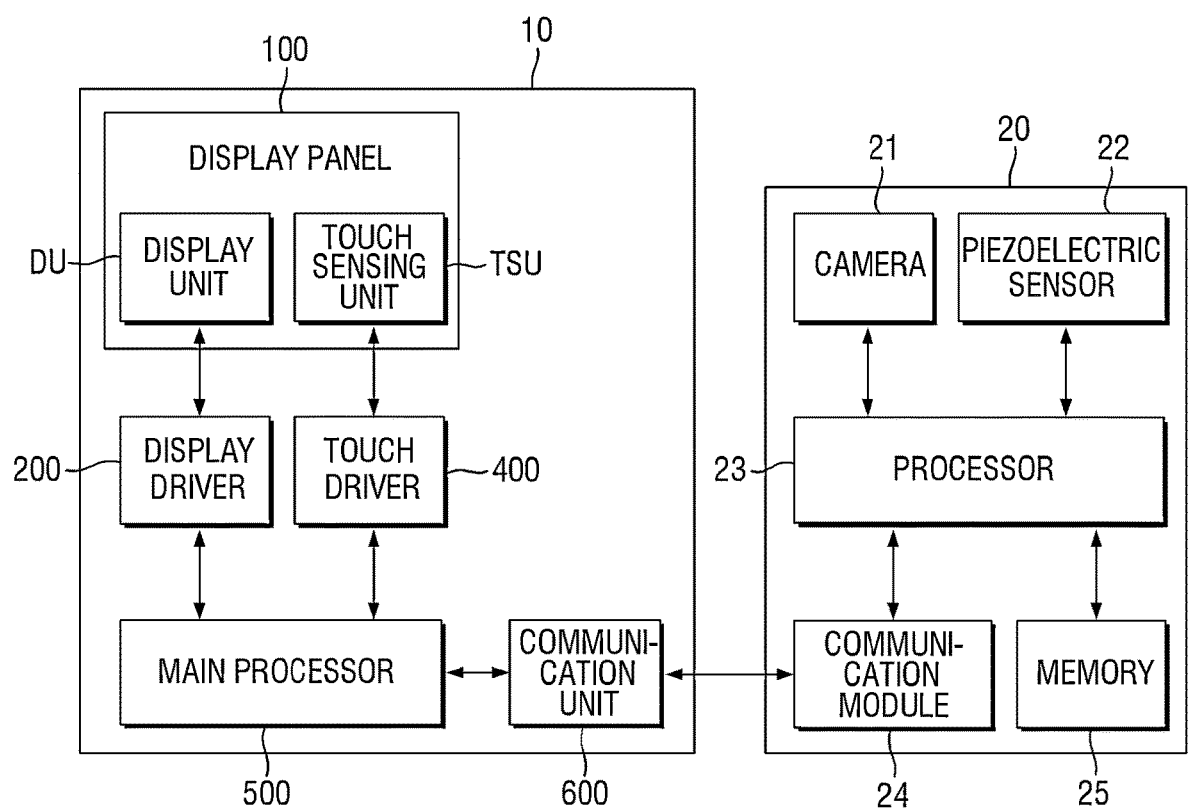
FIG. 19 is a schematic block diagram of a display device and an input device in the sensing system according to an embodiment.

FIG. 18 is a schematic perspective view of a sensing system according to an embodiment. FIG. 19 is a schematic block diagram of a display device 10 and an input device 20 in the sensing system according to an embodiment.

Referring to FIGS. 18 and 19, the sensing system may include the display device 10 and the input device 20.

The display device 10 may include a display panel 100, a display driver 200, a touch driver 400, a main processor 500, and a communication unit 600.

The display panel 100 may include a display unit DU and a touch sensing unit TSU.

The display unit DU may include pixels to display an image. The display unit DU may include a substrate SUB, a thin-film transistor layer TFTL, a light emitting element layer EML, and an encapsulation layer TFEL. The light emitting element layer EML may include light emitting elements LED and a pixel defining layer PDL.

The pixel defining layer PDL may include codes CD distinguished from pixel electrodes AND and touch electrodes SEN. A code pattern CP may include adjacent codes CD among first through third codes CD1 through CD3 and a code connection part CDN. Since the display device 10 may include a plurality of code patterns CP, the display device may sense a touch of the input device 20. Each of the code patterns CP may be determined by the planar shape of the pixel defining layer PDL to have position information. At least one code pattern CP or a combination of code patterns CP may correspond to values of preset data codes.

The touch sensing unit TSU may include a plurality of touch electrodes SEN to sense a user's touch in a capacitive manner.

The display driver 200 may output signals and voltages for driving the display unit DL The display driver 200 may supply data voltages to data lines. The display driver 200 may supply a power supply voltage to power lines and supply gate control signals to a gate driver.

The touch driver 400 may be connected to the touch sensing unit TSU. The touch driver 400 may supply a driving signal to the touch electrodes SEN of the touch sensing unit TSU and sense a change in capacitance between the touch electrodes SEN. The touch driver 400 may calculate whether a user's input has been made and input coordinates based on the change in capacitance between the touch electrodes SEN.

The main processor 500 may control all functions of the display device 10. For example, the main processor 500 may supply digital video data to the display driver 200 so that the display panel 100 displays an image. For example, the main processor 500 may receive touch data from the touch driver 400, determine input coordinates of a user, and then generate digital video data according to the input coordinates or execute an application indicated by an icon displayed at the input coordinates of the user. As another example, the main processor 500 may receive coordinate data from the input device 20, determine input coordinates of the input device 20, and then generate digital video data according to the input coordinates or execute an application indicated by an icon displayed at the input coordinates of the input device 20.

The communication unit 600 may perform wired or wireless communication with an external device. For example, the communication unit 600 may transmit and receive communication signals to and from a communication module 24 of the input device 20. The communication unit 600 may receive coordinate data composed of data codes from the input device 20 and provide the coordinate data to the main processor 500.

The input device 20 may make an input by approaching or touching the display device 10. The input device 20 may include a camera 21, a piezoelectric sensor 22, a processor 23, the communication module 24, a memory 25, and a battery 26. For example, the input device 20 may be an input pen that generates coordinate data using an optical method. The input pen may be, but is not limited to, a smart pen, an electromagnetic pen, or an active pen.

The camera 21 may be disposed at the front of the input device 20. The camera 21 may photograph the code patterns CP determined by the planar shape of the pixel defining layer PDL. The camera 21 may continuously photograph the code patterns CP at a corresponding position according to the movement of the input device 20. The camera 21 may provide a captured image to the processor 23.

The piezoelectric sensor 22 may sense the pressure applied to the display device 10 by the input device 20. The piezoelectric sensor 22 may provide pressure information of the input device 20 to the processor 23.

The processor 23 may receive an image of the code patterns CP from the camera 21. For example, the processor 23 may convert the code patterns CP into corresponding data codes and generate coordinate data by combining the data codes. The processor 23 may transmit the generated coordinate data to the display device 10 through the communication module 24.

Since the processor 23 may receive an image of the code patterns CP and convert at least one code pattern CP or a combination of code patterns CP into data codes corresponding one-to-one to the code patterns CP, the processor can rapidly generate coordinate data without complicated calculation and correction. Therefore, the sensing system can perform a corresponding function based on accurate input coordinates, reduce cost and power consumption, and simplify a driving process. Since the sensing system may include the code patterns CP determined by the shapes of the pixel electrodes AND and the pixel defining layer PDL of the display unit DU and the touch electrodes SEN of the touch sensing unit TSU, the sensing system can be applied to many electronic devices having a touch function without being limited by size.

The communication module 24 may perform wired or wireless communication with an external device. For example, the communication module 24 may transmit and receive communication signals to and from the communication unit 600 of the display device 10. The communication module 24 may receive coordinate data composed of data codes from the processor 23 and provide the coordinate data to the communication unit 600.

The memory 25 may store data needed to drive the input device 20. The input device 20 may convert at least one code pattern CP or a combination of code patterns CP into data codes corresponding one-to-one to the code patterns CP and immediately provide coordinate data to the display device 10. Therefore, the memory 25 with a relatively small capacity may be included.

According to a display device and a sensing system including the same according to embodiments, since the display device may include a pixel defining layer distinguished from pixel electrodes and touch electrodes and code patterns determined by the planar shape of the pixel defining layer, the display device may receive an input from an input device such as an input pen. At least one code pattern or a combination of code patterns may have position information according to specific criteria and may correspond one-to-one to preset data codes. Therefore, the display device and the sensing system including the same can perform a corresponding function based on accurate input coordinates, reduce cost and power consumption, and simplify a driving process by generating coordinate data composed of the data codes without complicated calculation and correction. The display device and the sensing system including the same can be applied to many electronic devices without being limited by size by including the code patterns formed of the pixel defining layer defining emission areas.

However, the effects of the disclosure are not restricted to the one set forth herein. The above and other effects of the disclosure will become more apparent to one of ordinary skill in the art to which the disclosure pertains by referencing the disclosure.

What is claimed is:

1. A display device comprising:
 a thin-film transistor layer disposed on a substrate, the thin-film transistor layer including a thin-film transistor;
 a light emitting element layer disposed on the thin-film transistor layer, the light emitting element layer including:
  a pixel defining layer defining emission areas; and
  a pixel electrode disposed in each of the emission areas;
 a touch electrode disposed on the light emitting element layer, the touch electrode overlapping the pixel defining layer and sensing a touch; and
 a code pattern defined by a planar shape of the pixel defining layer that is distinguished from the pixel electrode and the touch electrode, the code pattern having position information, wherein
 the pixel defining layer absorbs light of a specific wavelength, and
 the pixel electrode and the touch electrode reflect the light of the specific wavelength.

2. The display device of claim 1, wherein the pixel defining layer has a transmittance of about 15% or less for a wavelength of about 800 nm to about 900 nm.

3. The display device of claim 1, further comprising:
 an encapsulation layer overlapping the light emitting element layer,
 wherein the touch electrode is disposed on the encapsulation layer.

4. The display device of claim 1, further comprising:
 an encapsulation layer overlapping the light emitting element layer;
 an insulating layer disposed on the encapsulation layer;
 color filters disposed on the insulating layer in the emission areas; and
 a light blocking part disposed on the insulating layer adjacent to the color filters,
 wherein the touch electrode is overlapped by the insulating layer.

5. The display device of claim 1, further comprising:
 a polarizing film disposed on the light emitting element layer; and
 a base part disposed on the polarizing film,
 wherein the touch electrode is disposed on the base part.

6. The display device of claim 1, further comprising:
 a polarizing film disposed on the light emitting element layer; and
 a base part disposed on the polarizing film,
 wherein the touch electrode is disposed between the polarizing film and the base part.

7. The display device of claim 1, wherein
 the emission areas comprise:
  a first emission area emitting light of a first color;
  a second emission area emitting light of a second color different from the first color; and
  a third emission area emitting light of a third color different from the first and second colors, and
 the pixel defining layer comprises:
  a first code surrounding the first emission area and surrounded by the touch electrode;
  a second code surrounding the second emission area and surrounded by the touch electrode; and
  a third code surrounding the third emission area and surrounded by the touch electrode.

8. The display device of claim 7, wherein the pixel defining layer further comprises a code connection part exposed to the light of the specific wavelength by a cut part of the touch electrode and connecting adjacent codes among the first through third codes.

9. The display device of claim 8, wherein the code pattern comprises the adjacent codes among the first through third codes and the code connection part.

10. The display device of claim 7, wherein
 an area of the first emission area is larger than an area of the second emission area, and an area of the second code is larger than an area of the first code.

11. The display device of claim 1, further comprising:
an encapsulation layer overlapping the light emitting element layer;
color filters disposed on the encapsulation layer in the emission areas; and
a light blocking part disposed on the encapsulation layer adjacent to the color filters,
wherein the touch electrode is overlapped by the light blocking part.

12. The display device of claim 11, wherein
the light blocking part transmits the light of the specific wavelength.

13. A display device comprising:
a thin-film transistor layer disposed on a substrate, the thin-film transistor layer including a thin-film transistor;
a light emitting element layer disposed on the thin-film transistor layer, the light emitting element layer including:
a pixel defining layer defining emission areas;
a first electrode disposed in each of the emission areas;
a second electrode spaced apart from the first electrode in each of the emission areas; and
light emitting diodes disposed between the first electrode and the second electrode;
a touch electrode disposed on the light emitting element layer, the touch electrode overlapping the pixel defining layer and sensing a touch; and
a code pattern defined by a planar shape of the pixel defining layer that is distinguished from the first electrode, the second electrode, and the touch electrode, the code pattern having position information, wherein
the pixel defining layer absorbs light of a specific wavelength, and
the first electrode, the second electrode, and the touch electrode reflect the light of the specific wavelength.

14. The display device of claim 13, further comprising:
a wavelength conversion part disposed on the light emitting element layer to correspond to one of the emission areas, the wavelength conversion part converting a peak wavelength of light provided from the light emitting diodes;
a light blocking part adjacent to the wavelength conversion part; and
a base part disposed on the wavelength conversion part and the light blocking part,
wherein an upper surface of the touch electrode is overlapped by the light blocking part.

15. The display device of claim 13, further comprising:
a wavelength conversion part disposed on the light emitting element layer to correspond to one of the emission areas, the wavelength conversion part converting a peak wavelength of light provided from the light emitting diodes;
a light blocking part adjacent to the wavelength conversion part; and
a base part disposed on the wavelength conversion part and the light blocking part,
wherein the touch electrode is disposed between the light blocking part and the base part.

16. The display device of claim 15, wherein
the light blocking part transmits the light of the specific wavelength.

17. A display device comprising:
a thin-film transistor layer disposed on a substrate, the thin-film transistor layer including a thin-film transistor;
a light emitting element layer disposed on the thin-film transistor layer, the light emitting element layer including:
a pixel defining layer defining emission areas; and
a pixel electrode disposed in each of the emission areas;
a metal pattern disposed on the light emitting element layer, the metal pattern overlapping the pixel defining layer; and
a code pattern defined by a planar shape of the pixel defining layer that is distinguished from the pixel electrode and the metal pattern, the code pattern having position information, wherein
the pixel defining layer absorbs light of a specific wavelength, and
the pixel electrode and the metal pattern reflect the light of the specific wavelength.

18. The display device of claim 17, wherein the metal pattern is electrically independent and electrically floats.

19. A sensing system comprising:
a display device displaying an image; and
an input device approaching or touching the display device resulting in an input, wherein
the display device comprises:
a thin-film transistor layer disposed on a substrate, the thin-film transistor layer including a thin-film transistor;
a light emitting element layer disposed on the thin-film transistor layer, the light emitting element layer including:
a pixel defining layer defining emission areas; and
a pixel electrode disposed in each of the emission areas;
a touch electrode disposed on the light emitting element layer, the touch electrode overlapping the pixel defining layer and sensing a touch; and
code patterns defined by a planar shape of the pixel defining layer that is distinguished from the pixel electrode and the touch electrode, the code patterns having position information,
the input device photographs the code patterns,
the input device converts the code patterns into preset data codes,
the input device transmits coordinate data including the preset data codes to the display device,
the pixel defining layer absorbs lights of a specific wavelength, and
the pixel electrode and the touch electrode reflect the light of the specific wavelength.

* * * * *